United States Patent
Yu et al.

(10) Patent No.: US 10,872,836 B2
(45) Date of Patent: Dec. 22, 2020

(54) PACKAGE STRUCTURE FOR HEAT DISSIPATION

(71) Applicant: Taiwan Semiconductor Manufacturing Company, Ltd., Hsinchu (TW)

(72) Inventors: Chen-Hua Yu, Hsinchu (TW); Sung-Feng Yeh, Taipei (TW); Ming-Fa Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 59 days.

(21) Appl. No.: 16/230,552

(22) Filed: Dec. 21, 2018

(65) Prior Publication Data

US 2019/0115277 A1    Apr. 18, 2019

Related U.S. Application Data

(62) Division of application No. 15/720,565, filed on Sep. 29, 2017, now Pat. No. 10,163,750.
(Continued)

(51) Int. Cl.
*H01L 23/06* (2006.01)
*H01L 23/367* (2006.01)
(Continued)

(52) U.S. Cl.
CPC ...... *H01L 23/3675* (2013.01); *H01L 21/6835* (2013.01); *H01L 23/3677* (2013.01); *H01L 23/3736* (2013.01); *H01L 23/538* (2013.01); *H01L 25/0652* (2013.01); *H01L 25/0657* (2013.01); *H01L 25/18* (2013.01); *H01L 21/568* (2013.01); *H01L 23/49816* (2013.01); *H01L 23/5384* (2013.01); *H01L 23/5385* (2013.01); *H01L 24/16* (2013.01); *H01L 24/32* (2013.01);
(Continued)

(58) Field of Classification Search
CPC . H01L 2224/32145; H01L 2224/16145; H01L 25/0657; H01L 23/481; H01L 2225/06541; H01L 2225/06589; H01L 2924/1434; H01L 23/5226; H01L 23/49827
USPC .................................. 257/696, 777, 787
See application file for complete search history.

(56) References Cited

U.S. PATENT DOCUMENTS 6,917,090 B2 *  7/2005  Moden ................. H01L 21/563
                                                    257/431
7,589,426 B2 *  9/2009  Jiang ................ H01L 23/49816
                                                    257/780

(Continued)

FOREIGN PATENT DOCUMENTS

TW       1411088 B     10/2013

*Primary Examiner* — S. V. Clark
(74) *Attorney, Agent, or Firm* — Slater Matsil, LLP

(57) ABSTRACT

A package structure and method of manufacturing is provided, whereby heat dissipating features are provided for heat dissipation. Heat dissipating features include conductive vias formed in a die stack, thermal chips, and thermal metal bulk, which can be bonded to a wafer level device. Hybrid bonding including chip to chip, chip to wafer, and wafer to wafer provides thermal conductivity without having to traverse a bonding material, such as a eutectic material. Plasma dicing the package structure can provide a smooth sidewall profile for interfacing with a thermal interface material.

20 Claims, 50 Drawing Sheets

Related U.S. Application Data

(60) Provisional application No. 62/430,274, filed on Dec. 5, 2016, provisional application No. 62/460,580, filed on Feb. 17, 2017.

(51) Int. Cl.
  *H01L 23/373* (2006.01)
  *H01L 25/065* (2006.01)
  *H01L 25/18* (2006.01)
  *H01L 21/683* (2006.01)
  *H01L 23/538* (2006.01)
  *H01L 23/00* (2006.01)
  *H01L 21/56* (2006.01)
  *H01L 23/498* (2006.01)

(52) U.S. Cl.
  CPC .... *H01L 24/73* (2013.01); *H01L 2221/68345* (2013.01); *H01L 2224/08145* (2013.01); *H01L 2224/13082* (2013.01); *H01L 2224/13101* (2013.01); *H01L 2224/16145* (2013.01); *H01L 2224/16238* (2013.01); *H01L 2224/32225* (2013.01); *H01L 2224/73204* (2013.01); *H01L 2224/73253* (2013.01); *H01L 2225/06541* (2013.01); *H01L 2924/1203* (2013.01); *H01L 2924/1304* (2013.01); *H01L 2924/1431* (2013.01); *H01L 2924/1461* (2013.01)

(56) References Cited

U.S. PATENT DOCUMENTS

| | | | |
|---|---|---|---|
| 7,704,796 B2 | 4/2010 | Pagaila et al. | |
| 7,834,453 B2 * | 11/2010 | Chang | H01L 22/32 257/690 |
| 8,004,072 B2 | 8/2011 | Hedler et al. | |
| 8,455,301 B2 * | 6/2013 | Lee | H01L 21/561 257/622 |
| 8,592,950 B2 | 11/2013 | Pagaila et al. | |
| 8,710,676 B2 * | 4/2014 | Chou | H01L 23/3675 257/621 |
| 8,802,504 B1 | 8/2014 | Hou et al. | |
| 8,803,292 B2 | 8/2014 | Chen et al. | |
| 8,803,306 B1 * | 8/2014 | Yu | H01L 25/0652 257/686 |
| 8,803,316 B2 | 8/2014 | Lin et al. | |
| 8,841,765 B2 * | 9/2014 | Haba | H01L 25/0652 257/724 |
| 8,941,233 B1 * | 1/2015 | Ngai | H01L 25/50 257/712 |
| 8,993,380 B2 | 3/2015 | Hou et al. | |
| 9,209,166 B2 | 12/2015 | Pratt | |
| 9,281,254 B2 | 3/2016 | Yu et al. | |
| 9,299,649 B2 | 3/2016 | Chiu et al. | |
| 9,496,189 B2 | 3/2016 | Yu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 2007/0284758 A1 * | 12/2007 | Zhang | H01L 24/11 257/780 |
| 2008/0032448 A1 | 2/2008 | Simon et al. | |
| 2008/0054436 A1 * | 3/2008 | Baek | H01L 23/367 257/686 |
| 2008/0142990 A1 | 6/2008 | Yu et al. | |
| 2015/0155218 A1 * | 6/2015 | Hung | H01L 23/42 257/690 |
| 2016/0013115 A1 | 1/2016 | Vadhavkar et al. | |
| 2016/0260687 A1 | 9/2016 | Gao et al. | |
| 2018/0063963 A1 | 3/2018 | Flaim | |
| 2018/0158749 A1 | 6/2018 | Yu et al. | |

* cited by examiner

PACKAGE STRUCTURE FOR HEAT DISSIPATION

PRIORITY CLAIM AND CROSS-REFERENCE

This application is a divisional of U.S. patent application Ser. No. 15/720,565 filed on Sep. 29, 2017, and entitled "Package Structure for Heat Dissipation," which claims the benefit of the following provisionally filed U.S. Patent applications: Application No. 62/430,274, filed Dec. 5, 2016, and entitled "Package Structure for Heat Dissipation," and Application No. 62/460,580, filed Feb. 17, 2017, and entitled "3DIC Packages with Fusion and Hybrid Bonding and Methods of Forming Same," which applications are hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

As semiconductor technologies further advance, stacked semiconductor devices, e.g., three dimensional integrated circuits (3DICs), have emerged as an effective alternative to further reduce the physical size of semiconductor devices. In a stacked semiconductor device, active circuits such as logic, memory, processor circuits, and the like are fabricated on different semiconductor wafers. Two or more semiconductor wafers may be installed or stacked on top of one another to further reduce the form factor of the semiconductor device. Package-on-package (POP) devices are one type of 3DIC wherein dies are packaged and are then packaged together with another packaged die or dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
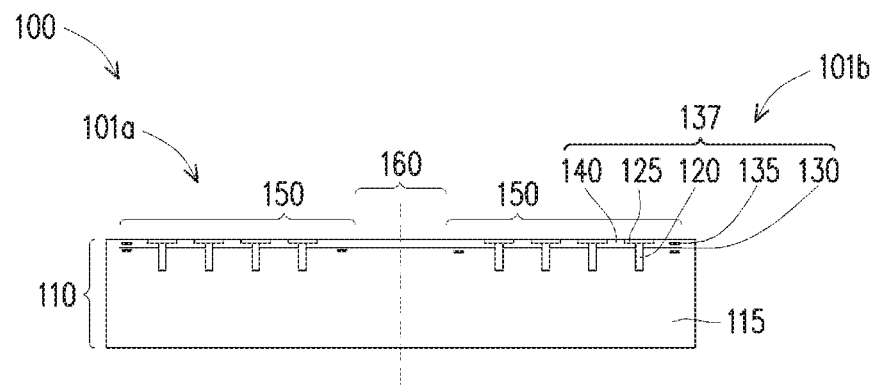
FIGS. 1 through 11 illustrate intermediate steps in a process of forming a die stack, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments provide a multi-die stacking structure (a die stack or chip stack) which includes heat dissipation through the use of a dummy thermal chip, through silicon vias (TSVs), thermal copper (Cu), or Cu bulk, or the like. Dies are stacked and bonded using a hybrid bonding technique. The structure can provide a multi-chip stack with chips of the same or different sizes. Chips can be singulated using plasma or laser dicing to provide smooth sides. Trenches can be formed in the backside of the package and filled with a thermal interface material (TIM) to provide heat dissipation. Embodiments can use hybrid bonding to provide die-to-die (chip on chip), die-to-wafer (chip on wafer), or wafer-to-wafer (wafer on wafer) bonding without using a material between bonded structures. Stacked chips can be thinned to provide for heat dissipation.

One problem faced in stacking packages or chips in a 3DIC package is heat dissipation. Heat created by the operation of a high performance device can inhibit performance. Molding compounds and underfill material traditionally used can inhibit heat dissipation and negatively impact the resulting package. By multi-die stacking using the disclosed embodiments can provide for high performance heat dissipation for high performance devices, such as a system-in-package (SiP) device or solution.

FIGS. 1 through 11 illustrate intermediate steps in a process of forming a die stack, in accordance with some embodiments. Referring to FIG. 1, a portion of a semiconductor device 100 is illustrated. In the illustrated embodiments, the semiconductor device 100 comprises a processed wafer 110 having contact pads 125 formed thereon. In some embodiments, the semiconductor device 100 comprises one or more known good die (KGD) which have been functionally tested. Processed wafer 110 can comprise package areas or die areas 150 and non-package or non-die areas 160. Generally, active and passive devices are formed in the die areas 150 and the non-die areas 160 do not have any active or passive devices formed therein. The non-package areas 160 can include dicing streets for singulating the die areas 150 into separate integrated circuit packages 101a and 101b.

In some embodiments, the processed wafer 110 comprises a substrate 115, various active and passive devices on the substrate (not specifically shown), various metallization layers 130 (e.g., of interconnect 137) over the substrate, vias 120 formed in the substrate, and seal rings 135 formed in a peripheral area of a die. Vias 120 can include dummy vias which are not electrically coupled to a device in the processed wafer 110 and conductive vias which are electrically coupled to at least one device or conductive feature in the processed wafer 110. Dummy vias can be formed, for example, for heat dissipation of the substrate. Conductive vias can also serve for dissipating heat which may be a second purpose for the conductive vias.

Vias 120 are conductive and may be formed for a primary purpose of conducting heat away from heat generating devices in the substrate 115. Thermally conductive vias 120 may traverse a substantial portion of the substrate 115, such as the entire depth of the substrate or the entire depth of a portion of the substrate 115 having active and passive devices formed therein. Embodiments can also contain other vias (not shown) used for other purposes in the substrate 115.

Vias 120 can be formed in the substrate by any suitable means. For example, vias can be formed by depositing a mask over the wafer, patterning the mask to form openings therein corresponding to the vias location, etching recesses in the substrate using the patterned mask, depositing an optional seed layer in the openings, depositing, for example, by electroplating, a conductive material in the openings, and removing the mask, for example, by an ashing process. Other methods can be used to create vias 120.

The substrate may be formed of silicon, although it may also be formed of other group III, group IV, and/or group V elements, such as silicon, germanium, gallium, arsenic, and combinations thereof. The substrate may also be in the form of silicon-on-insulator (SOI). The SOI substrate may comprise a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like.

In some embodiments, the variety of active and passive devices may include various n-type metal-oxide semiconductor (NMOS) and/or p-type metal-oxide semiconductor (PMOS) devices such as transistors, capacitors, resistors, diodes, photo-diodes, fuses and/or the like.

In some embodiments, the metallization layers 130 of interconnect 137 may be formed over the active and passive devices and are designed to connect the various devices to form functional circuitry. The interconnect 137 may be formed of alternating layers of an insulating material 140, such as a dielectric (e.g., low-k dielectric material), and conductive materials (e.g., copper) with vias (such as vias 120 or other vias) interconnecting the layers of conductive material 130 and may be formed through any suitable process (such as deposition, damascene, dual damascene, or the like). The insulating material 140 may be formed, for example, from phosphosilicate glass (PSG), borophosphosilicate glass (BPSG), FSG, $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), and plasma enhanced CVD (PECVD).

In some embodiments, the processed wafer 110 may be a logic wafer, a memory wafer, a sensor wafer, an analog wafer, or the like. The processed wafer 110 may be formed using a complementary metal-oxide-semiconductor (CMOS) process, a micro-electro-mechanical systems (MEMS) process, a nano-electro-mechanical systems (NEMS) process, the like, or a combination thereof. As described below in greater detail, the processed wafer 110 will be stacked and singulated form stacked die structures.

Referring further to FIG. 1, contact pads 125 are formed on the processed wafer 110. The contact pads 125 are physically and electrically coupled to circuitry in the processed wafer 110, such as a via 120 (either an active via or dummy via) or a interconnect 130. The contact pads 125 can eventually be coupled to external circuitry as described below in greater detail. The contact pads 125 may comprise a conductive material such as copper, tungsten, aluminum, silver, gold, the like, or a combination thereof, and may be formed by an electro-chemical plating process, an electro-less plating process, ALD, PVD, the like, or a combination thereof. In some embodiments, the contact pads 125 may further comprise a thin seed layer (not shown), wherein the conductive material of the contact pads 125 is deposited over the thin seed layer. The seed layer may comprise copper, titanium, nickel, gold, manganese, the like, or a combination thereof, and may be formed by ALD, PVD, sputtering, the like, or a combination thereof.

The conductive material of the contact pads 125, such as aluminum, is deposited over the processed wafer 110 and patterned to form the contact pads 125 as illustrated in FIG. 1. The contact pads 125 may be patterned using photolithography techniques. Generally, photolithography techniques involve depositing a photoresist material, which is subsequently irradiated (exposed) and developed to remove a portion of the photoresist material. The remaining photoresist material protects the underlying material, such as the conductive material of the contact pads 125, from subsequent processing steps, such as etching. A suitable etching process, such as a reactive ion etch (RIE) or other dry etch, an isotropic or anisotropic wet etch, or any other suitable etch or patterning process may be applied to the conductive material of the contact pads 125 to remove the exposed portion of the conductive material and form the contact pads 125. For example, exposed portions of the conductive material such as aluminum may be etched using a mixture of 80% phosphoric acid, 5% nitric acid, 5% acetic acid, and 10% de-ionized (DI) water.

In other embodiments, the contact pads 125 may be formed using alternative methods. For example, a photoresist material may be deposited over the processed wafer 110, and subsequently irradiated (exposed) and developed to remove a portion of the photoresist material to form openings. The openings in the photoresist material are then filled with a conductive material to form the contact pads 125. Subsequently, the photoresist material is removed and an insulating material 140, such as described above with reference to the interconnect 130, can optionally be added to partially or fully surround the vertical extents of the contact pads 125. Alternatively, the contact pads 125 can be left on the surface of the processed wafer 110, extending above the surface of the processed wafer 110.

In some embodiments, a top surface of the processed wafer 110 can be planarized to make a top of the contact pads 125 substantially co-planar within process variations with a top surface of an insulating material 140 (e.g., as a top layer of an interconnect 130, as described above). In some embodiments, contact pad 125 can extend above the surrounding insulating material 140, as a result of the formation of the contact pad 125. In some embodiments, contact pad 125 can extend above the surrounding insulating material 140 by etching back using a suitable etching technique to recess the surrounding insulating material 140 following planarization.

In some embodiments, one or more of vias 120 can be exposed at a top surface of the processed wafer 110 without adding a contact pad, such as contact pad 125. For example, the vias 120 can be exposed using a planarization technique, such as a CMP or etch. A top of the exposed vias 120 can extend above the surrounding insulating material 140 by etching back the insulating material 140 using a suitable etching technique to recess the surrounding insulating material 140 following planarization or in combination with planarization.

Figure 2:
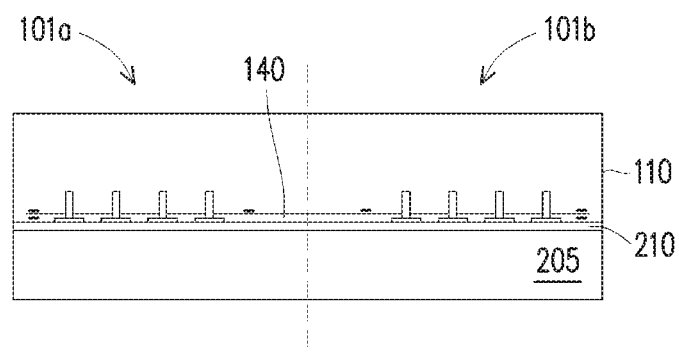

Referring to FIG. 2, the processed wafer 110 can be flipped over and attached to a carrier 205. Generally, carrier 205 provides temporary mechanical and structural support various features (e.g., processed wafer 110) during subsequent processing steps. In this manner, damage to the device dies is reduced or prevented. Carrier 205 may comprise, for example, glass, ceramic, bulk silicon, and the like. In an embodiment, release layer 210 is used to attach processed wafer 110 to carrier 205. In some embodiments, carrier 205 may be substantially free of any active devices and/or functional circuitry. In some embodiments, carrier 205 may comprise bulk silicon, and processed wafer 110 may be attached to carrier 205 by a dielectric release layer 210. In some embodiments, the carrier 205 may comprise a support tape.

Release layer 210 may be any die attach film or any suitable adhesive, epoxy, ultraviolet (UV) glue (which loses its adhesive property when exposed to UV radiation), or the like. Release layer 210 may be formed using a deposition process, a spin coating, a printing process, a lamination process, or the like over the surface of the carrier 205 or over the surface of the processed wafer 110. A surface of release layer 210 opposite insulating material 140 may be substantially level (e.g., planarized) to provide a suitable surface for carrier 205 to adhere to. In some embodiments, the release layer 210 may have a multilayer structure. In other embodiments, the release layer 210 may be a thermal type, wherein adhesive strength of the release layer is substantially reduced after exposing the release layer 210 to a suitable heat source.

In some embodiments, attaching the processed wafer 110 to the carrier 205 uses a fusion bonding process where an insulating layer of the processed wafer 110 (e.g., insulating material 140 or a subsequently deposited dielectric layer) is directly bonded to a dielectric release layer 210 to form a insulator-to-insulator bond. Further details on fusion bonding are discussed below in conjunction with hybrid bonding, with respect to FIG. 17.

In some embodiments, the processed wafer 110 is singulated into individual integrated circuit packages 101a and 101b, for example, by sawing, laser ablation, or the like. Subsequently, the carrier 205 can be removed from each of the integrated circuit packages 101a and 101b. Removing the carrier 205 may include applying UV radiation to release layer 210, a mechanical grinding process, an etch back process, a heating process, combinations thereof, or the like. In some embodiments, the resulting integrated circuit packages 101a and 101b can be tested to identify known good dies (KGDs) for further processing. In some embodiments, testing can be done for KGD prior to singulation or prior to removal of the carrier 205. The resulting integrated circuit packages 101a and 101b can be referred to as packages, dies, or chips.

Figure 3:
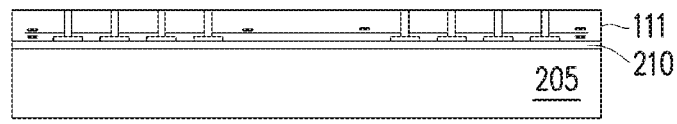

Referring to FIG. 3, in embodiments where the integrated circuit packages are left as a processed wafer 110, the processed wafer 110 is thinned to create processed wafer 111. Thinning can be done by a CMP process, etching, or other suitable process. Thinning exposes vias 120 and also reduces the thickness to provide better heat dissipation and take less space. After thinning, the processed wafer 111 can be about 10 to 50 µm thick, for example, about 20 µm thick.

Figure 4:
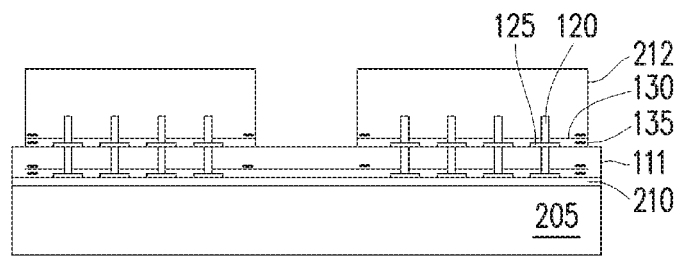

Referring to FIG. 4, dies 212 are bonded to processed wafer 111. In some embodiments, the dies 212 are attached to the processed wafer 111 using, for example, a pick and place apparatus. In other embodiments, the dies 212 may be attached to the processed wafer 111 manually, or using any other suitable method.

Dies 212 can be the same type of device as the devices in processed wafer 111 or can be a different type of device. For example, if making a memory cube, dies 212 can be the same as the devices present in the processed wafer 111. In particular, dies 212 can correspond to integrated circuit packages 101a or 101b, for example. That is, dies 212 can result from the singulation of another processed wafer consistent with processed wafer 110, as described above. In some embodiments, dies 212 are KGDs.

In some embodiments, contact pads 125 of dies 212 are hybrid bonded to vias 120 of processed wafer 111. Hybrid bonding has a benefit of not needing solder materials between the two bonded connectors. Hybrid bonding creates a bonding interface between two devices which includes direct metal-to-metal bonding of the metal features in a first device to metal features in a second device as well as fusion bonding (or dielectric-to-dielectric bonding) of insulating materials in the first device to insulating materials in the second device. Any suitable hybrid bonding process can be used; however, a process for hybrid bonding is described in detail below with respect to FIGS. 17 and 18.

In some embodiments, prior to hybrid bonding, contact pads (not shown) can be formed over the vias 120 of the processed wafer 111. A process for forming contact pads is described above with respect to FIG. 1 and is not repeated.

In some embodiments, the dies 212 are hybrid bonded to the processed wafer 111. In the hybrid bonding, the contact pads 125 of dies 212 are directly bonded to vias 120 of processed wafer 111. Also, the insulating materials 140 of dies 212 and the substrate 115 of processed wafer 111 (see FIG. 1) are fusion bonded together. Thus, no underfill is needed between the dies 212 and the processed wafer 111. The process for hybrid bonding will be described in more detail below with respect to FIGS. 17 and 18.

In other embodiments, dies 212 can be bonded to vias 120 by forming a eutectic-type connector or contact pad over the vias 120 of the processed wafer 111, bringing the dies 212 and processed wafer 111 together after aligning the corresponding contacts, and reflowing the eutectic materials to form a physical and electrical coupling. Alternatively, a eutectic-type connector can be formed on the dies 212 or both the dies 212 and processed wafer 111. In such embodiments, an underfill material can be used between the dies 212 and processed wafer 111, or alternatively a gap-fill material, such as described below, can provide underfill capabilities.

Figure 5:
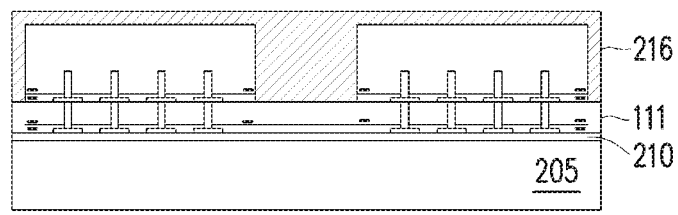

Referring to FIG. 5, a gap-fill material 216 is formed over the workpiece to substantially fill the spaces between dies 212. In some embodiments, the gap-fill material 216 can extend over the dies 212. In some embodiments, the spaces may only partially be filled by the gap-fill material 216. In some embodiments, the gap-fill material 216 may comprise a molding compound such as an epoxy, a resin, a moldable polymer, polymide, or the like. The molding compound may be applied while substantially liquid, and then may be cured through a chemical reaction, such as in an epoxy or resin. In other embodiments, the molding compound may be an ultraviolet (UV) or thermally cured polymer applied as a gel or malleable solid. In some embodiments, the gap-fill material 216 may comprise a non-polymer like silicon dioxide, silicon nitride, or the like, such as another oxide or nitride, which is deposited using any suitable process. For example, the gap-fill material may be formed by CVD, PECVD or ALD deposition process, FCVD, or a spin-on-glass process.

Figure 6:
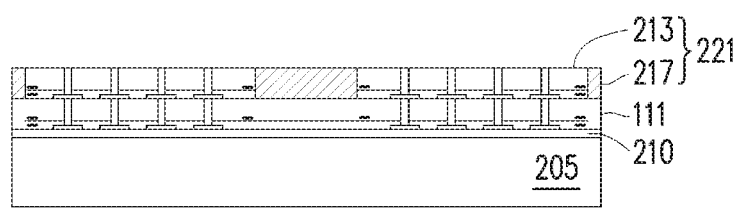

Referring to FIG. 6, the gap-fill material 216 and dies 212 can be thinned to create gap-fill material 217 and thinned dies 213. Thinning can be done by a CMP process, grinding, etching, or other suitable process. Thinning exposes vias 120 in dies 213 and also reduces the thickness of dies 213 to provide better heat dissipation and take less space. After thinning, the dies 213 can be about 10 to 50 μm thick, for example, about 20 μm thick. In some embodiments, a top surface of the gap-fill material 217 and dies 213 are substantially co-planar within process variations. The layer 221 comprises the combined gap-fill material 217 and dies 213.

Figure 7:
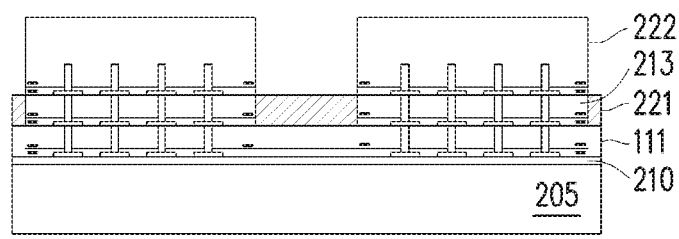

Referring to FIG. 7, in some embodiments, second dies 222 are bonded to dies 213. In some embodiments, die 222 can be the same type of device or chip as die 212. In some embodiments, die 222 can be a different type of device or chip. Dies 222 can be bonded to dies 213 in like manner as dies 212 are bonded to processed wafer 111, such as described above with respect to FIG. 4, and is not repeated here. In particular, dies 222 can be hybrid bonded to dies 213 by a direct bonding of contact pads 125 of dies 222 and vias 120 or contact pads of dies 213 and fusion bonding of the insulating materials 140 of dies 222 and the substrate 115 (see FIG. 1) of dies 213.

Figure 8:
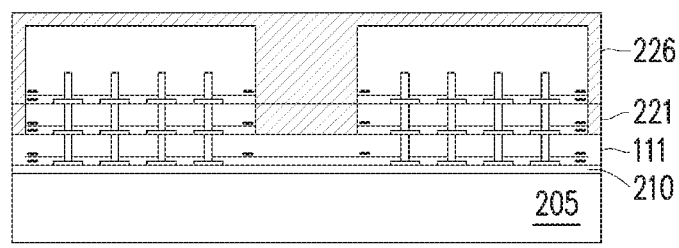

Referring to FIG. 8, a gap-fill material 226 is formed over the workpiece to substantially fill the spaces between dies 222. The process and materials is the same as those discussed above in relation to FIG. 5 for the formation of gap-fill material 216, and is not repeated.

Figure 9:
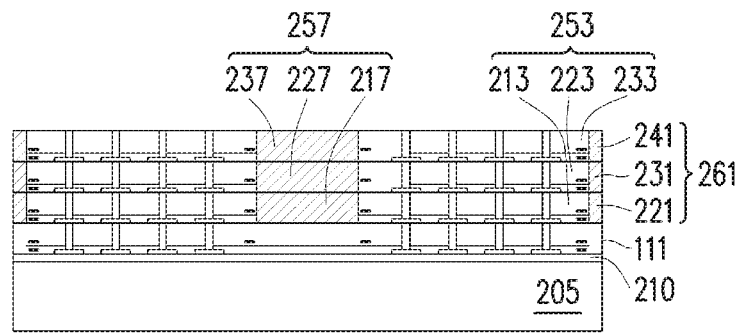

Referring to FIG. 9, the gap-fill material 226 and dies 222 have been thinned to create gap-fill material 227 and thinned dies 223. Thinning can be done in a similar manner as described above with respect to FIG. 6, resulting in a layer 231 that can be about 10 to 50 μm thick, for example, about 20 μm thick, comprising gap-fill material 227 and thinned dies 223.

Still referring to FIG. 9, the process of FIGS. 7-9 can be repeated to bond additional dies to the die stack. For example, FIG. 9 illustrates a fourth layer 241 comprising a thinned die 233 and gap-fill material 237. One of skill in the art will understand that fewer or additional layers can be included than the number of layers illustrated. Although shown in distinctive layers, in some embodiments, the combined gap-fill material 257 can appear as a single material layer. In other embodiments, the combined gap-fill material 257 will maintain individual layers. The thinned die stack 253 comprises a combination of the thinned dies 213, 223, and 233.

Figure 10:
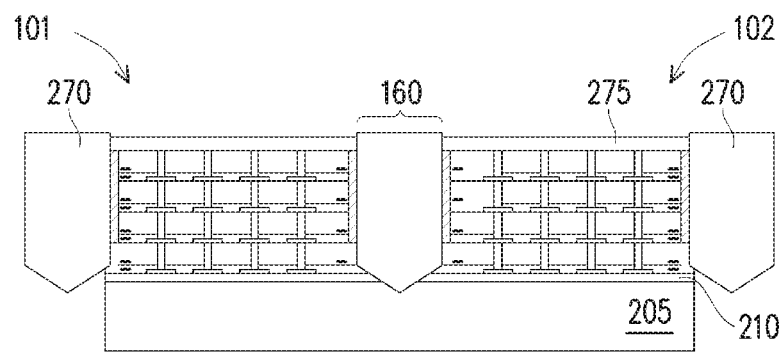
Figure 11:
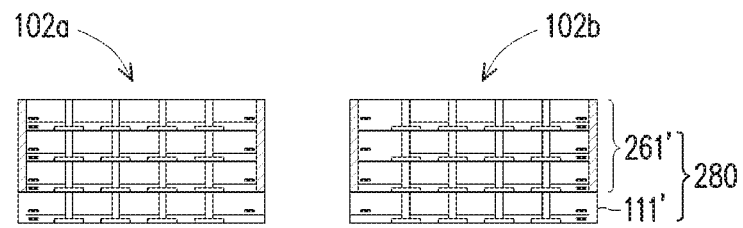

Referring to FIG. 10, the integrated circuit dies comprising die stacks can be singulated from the workpiece, resulting in integrated circuit packages 102a and 102b (of FIG. 11). Singulation 270 can occur by any acceptable process, including plasma dicing, laser dicing, mechanical saw, or a combination thereof. Singulation occurs through the non-package regions 160 on scribe lines or dicing streets of the workpiece. The singulation cuts through the processed wafer 111, down to the release layer 210. In some embodiments, the singulation can continue through the release layer 210 and may continue into or through the carrier 205.

An advantage of plasma dicing packages 102a and 102b is that, with the gap-fill material 257, smooth sidewall profiles can be achieved through the plasma dicing.

Plasma dicing can be achieved by performing an etch of the layers of gap-fill material. A mask 275 can be deposited over the die stacks and patterned to expose the gap-fill material 257 for singulation. When the gap-fill material 257 is polysilicon, a process gas for plasma dicing may include $Cl_2/NF_3/He$ or $SF_6$ or $NF_3$ or $CF_4$ or other suitable halogens based etch gas at a temperature of less than 200° C. (e.g., less than 100° C.), an RF power of less than 3 kW (e.g., less than 600 W), and at a pressure of less than 10 torr (e.g., less than 3 torr). When the gap-fill material 257 is a silicon oxide, a process gas for plasma dicing may include $C_4F_6$ or a fluorine-based gas, at a temperature of less than 200° C. (e.g., less than 150° C.), an RF power of greater than 50 W (e.g., greater than 100 W), and at a pressure of less than 3 torr (e.g., less than 200 mtorr). When the gap-fill material 257 is a SiOC, a process gas for plasma dicing may include $N_2$ and $H_2$, or $SO_2$ and $O_2$, at a temperature of less than 200° C. (e.g., 20-100° C.), an RF power of greater than 100 W (e.g., greater than 300 W), and at a pressure of less than 3 torr (e.g., less than 200 mtorr).

Process gasses and environment can be adjusted based on the material of the gap-fill material 257. To continue to plasma dicing through the processed wafer 111, the process gasses may be adjusted to suitably etch the processed wafer 111, depending on the material of the processed wafer 111. Similarly, to continue to plasma dicing through the carrier 205, the process gasses may be adjusted to suitably etch the carrier 205, depending on the material of the carrier 205.

Referring to FIG. 11, following the dicing, the carrier 205 is removed from the packages 102a and 102b. Removing the carrier 205 may include applying UV radiation to release layer 210, a mechanical grinding process, an etch back process, a heating process, combinations thereof, or the like.

In some embodiments, the packages 102a and 102b are memory cubes 280, comprising a wafer layer 111' and stacked chips 261'. Following the singulation, additional processing or packaging can be applied to the packages 102a and 102b, for example, forming contacts thereon, mounting another package thereto, or mounting into another device or structure.

FIGS. 12 through 16 illustrate intermediate steps in a process of forming a die stack, in accordance with some embodiments. Embodiments consistent with those illustrated in FIGS. 12 through 16 are similar to the embodiments illustrated in FIGS. 1 through 11 except that in the embodiments illustrated in FIGS. 12 through 16, rather than provide a processed wafer on carrier 205, individual packages, such as integrated circuit packages 101a and 101b, are attached to carrier 205. The processes and materials used to form embodiments such as illustrated in FIGS. 12 through 16 that are similar to those for the previously described embodiments will not be repeated.

Figure 12:
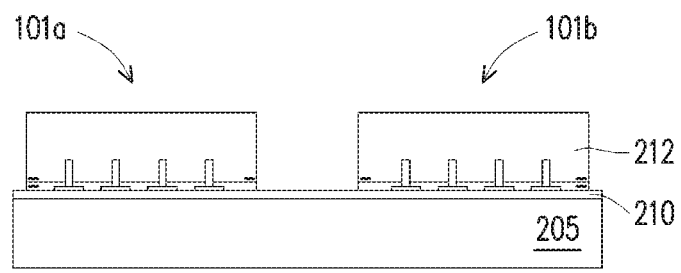
FIGS. 12 through 16 illustrate intermediate steps in a process of forming a die stack, in accordance with some embodiments.

Referring to FIG. 12, the dies 212 are attached to the carrier 205 using, for example, a pick and place apparatus. In other embodiments, the dies 212 may be attached to carrier 205 manually, or using any other suitable method. Dies 212 can be attached to carrier 205 via a release layer 210 or fusion bonded to carrier 205, in a process and using materials such as described above with respect to the attachment of processed wafer 110 to carrier 205 of FIG. 2.

Figure 13:
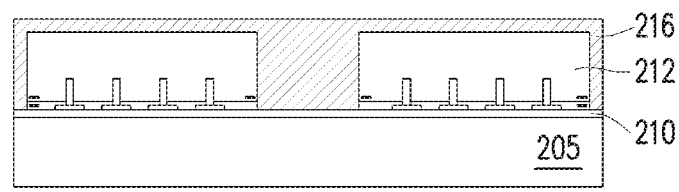

Referring to FIG. 13, a gap-fill material 216 is formed over the dies 212. The process and materials can be the same as described above with respect to FIG. 5, and is not repeated.

Figure 14:
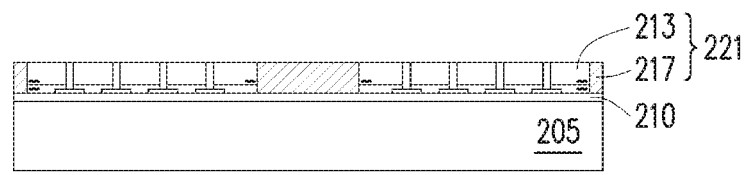

Referring to FIG. 14, in some embodiments, the gap-fill material 216 and dies 212 of FIG. 13 can be thinned using processes and materials such as described above with respect to FIG. 6, and is not repeated. The resulting layer 221, which includes the thinned gap-fill material 217 and thinned dies 213, can be between about 10 and 50 µm thick, such as about 20 µm.

Figure 15:
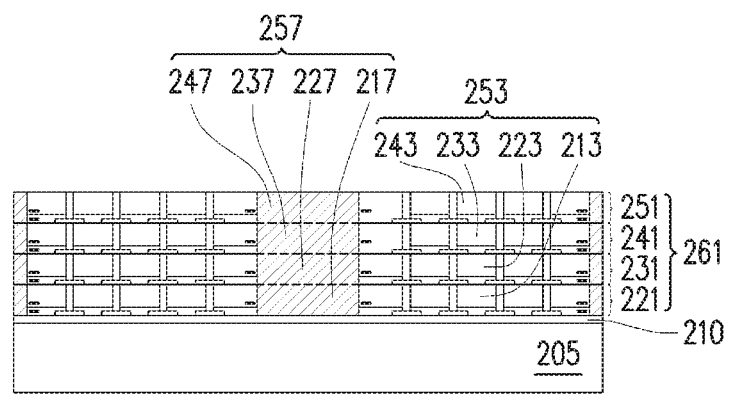

Referring to FIG. 15, the processes of FIGS. 12 through 14 can be repeated to attach additional dies. Additional dies can be attached by bonding using processes and materials similar to those described above with respect to FIG. 4, which is not repeated. Four total layers 261 include individual layers 221, 231, 241, and 251. One of skill will understand that additional layers can be included or fewer layers can be included. As few as two layers can be provided. Although shown in distinctive layers of gap-fill material 217, 227, 237, and 247, in some embodiments, the combined gap-fill material 257 can appear as a single material layer. In other embodiments, the combined gap-fill material 257 will maintain individual layers. The thinned die stack 253 comprises a combination of the thinned dies 213, 223, 233, and 243.

Figure 16:
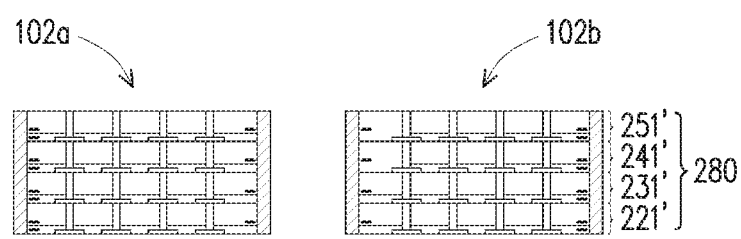

Referring to FIG. 16, the integrated circuit dies comprising die stacks can be singulated from the workpiece, resulting in integrated circuit packages 102a and 102b. Singulation can occur by using processes and materials such as described above with respect to FIG. 10, such as plasma dicing, laser dicing, mechanical saw, or a combination thereof, and is not repeated. Following the dicing, the carrier 205 is removed from the packages 102a and 102b. Removing the carrier 205 can include processes and materials such as described above with respect to FIG. 11, and is not repeated.

In some embodiments, the packages 102a and 102b of FIG. 16 are memory cubes 280, comprising stacked chip layers 221', 231', 241', and 251'. Following the singulation, additional processing or packaging can be applied to the packages 102a and 102b, for example, forming contacts thereon, mounting another package thereto, or mounting into another device or structure.

Figure 17:
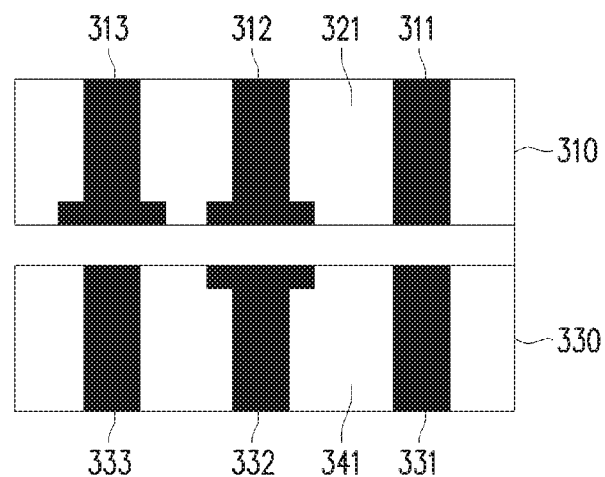
FIGS. 17 through 18 illustrate hybrid bonding processes, in accordance with some embodiments.

Referring to FIG. 17, structures for a hybrid bonding process are illustrated. Structures 310 and 330 are portions of different chips, wafers, dies, integrated circuit devices, packages, and so forth which are to be hybrid bonded. FIG. 17 illustrates three different types of hybrid bonding structures. Structure 310 has a via 311, a via with contact pad 312, and a via with contact pad 313. Structure 330 has a via 331, a via with contact pad 332, and a via 333. Hybrid bonding includes direct metal-to-metal bonding of the metal features in the structure 310 and structure 330 as well as fusion bonding insulating materials 321 in the structure 310 with insulating materials 341 in the structure 330.

Direct bonding may occur between a via with contact pad 313 and via 333, a via with contact pad 312 and via with contact pad 332, and a via 311 and via 331. In some embodiments, the contact pads, e.g., 312, 313, and 332, can be bonded to an underbump metallization or to a metal line, for example, from a redistribution layer. The bonding of via 311 to via 331 is representative of a via-to-via hybrid bonding. The bonding of the contact pad of 312 to the contact pad of 332 is representative of a pad-to-pad hybrid bonding. The bonding of the contact pad of 313 to the via 333 is representative of a via-to-pad or pad-to-via hybrid bonding. The vias and contact pads of structures 310 and 330 are made of conductive materials, such as copper, gold, tin, and the like, or alloys thereof. The conductive materials of each of the vias or contact pads in structure 310 can be the same or different than the conductive materials in structure 330.

Structures 310 and 330 also comprise an insulating material 321 and 341, respectively. Insulating material can be an oxide, oxynitride, dielectric, polymer, and so forth. In some embodiments, insulating material 321 can be the same material as insulating material 341, while in other embodiments, insulating material 321 can be different than insulating material 341.

In a hybrid bonding process, the vias and pads of structure 310 are aligned and contacted to the vias and pads of structure 330. Insulting materials 321 of structure 310 are also be contacted to insulating materials 341 of structure 330. Subsequently an anneal may be performed to directly bond the conductive materials and fusion bond the insulating materials together. The anneal causes the inter-diffusion of the metals in the pad/pad/via of 310 and via/pad/via of 330 to cause a direct metal-to-metal bond. In some embodiments, when insulating material 321 or 341 comprises a polymer, the annealing temperature is lower than about 250° C. in order to avoid damage to the polymer. For example, the annealing temperature (with the presence of polymer) may be in the range between about 150 C and about 250 C, such as about 200 C. The annealing time may be between about 1 hour and 3 hours, such as about 1.5 hours. In embodiments where both insulating materials 321 or 341 are formed of inorganic dielectric materials such as an oxide or oxynitride, the annealing temperature may be higher, which is lower than about 400 C. For example, the annealing temperature (without the presence of polymer) may be in the range between about 250 C and about 400 C, such as about 325 C and the annealing time may be in the range between about 1 hour and about 3 hours, such as about 1.5 hours.

The bonded conductive materials of structures 310 and 330 may have distinguishable interfaces. The insulating material 321 may also be fusion bonded to the insulating material 341, with bonds formed therebetween. For example, the atoms (such as oxygen atoms) in one of the insulating materials 321 and 341 can form chemical or covalence bonds (such as O—H bonds) with the atoms (such as hydrogen atoms) in the other one of the insulating materials 321 and 341. The resulting bonds between the insulating materials 321 and 341 are insulator-to-insulator bonds, which may be inorganic-to-polymer, polymer-to-polymer, or inorganic-to-inorganic bonds in accordance with various embodiments. Slight variations in surfaces of the bonding structures can be overcome through the annealing process while pressure keeps the structures together. In some embodiments a pressing force of about 1 to 10 Newtons can be exerted, such as about 6 Newtons, to press the structures 310 and 330 together. Hybrid bonding can occur in an environment from about 1 atm to about 100 atm, such as about 5 atm. Expansion of materials under anneal temperatures can complete the bonding and substantially eliminate voids.

Prior to bonding, the structures 310 and 330 can be prepared, for example by a CMP or grinding process to expose contacts or thin the structures. In some embodiments, hybrid bonding may enable connectors to have a fine pitch, for example less than about 5 µm. As such, hybrid bonding may allow dies, such as dies 101a and 101b to comprise a high density of connections. Further, the hybrid bonding process allows for the bond between the two structures to not include a solder material, and thus, may increase the reliability and yield of package structures. Further still, because no connectors are used between dies, the hybrid ponding process results in a thinner die stack.

Figure 18:
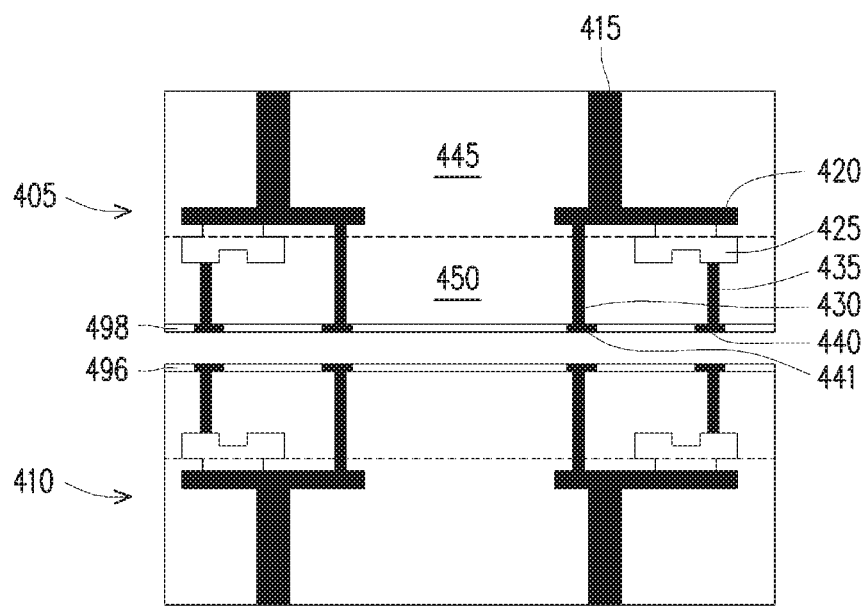

Referring to FIG. 18, a hybrid bonding process is illustrated when one or more of the devices being bonded are known good dies (KGDs). In such embodiments, KGD testing may require an aluminum pad for KDG testing. Structure 405 can be bonded to structure 410. Structure 405 and structure 410 can each be a portion of a die, wafer, package, and so forth. A via 415 is electrically coupled to a metal layer 420. An aluminum pad 425 is formed on the metal layer. Insulating layer 445 is part of the die or wafer for KGD. For illustration purposes, two possible options are provided to bond a wafer or die having an aluminum pad. A further insulating layer 450 is formed over the die or wafer.

In some embodiments, an opening is formed down to the metal layer 420. The opening is filled with a conductive material to form via 430 to the metal layer 420. In some embodiments, an opening is formed down to the aluminum pad 425. In some embodiments, the opening is filled with a conductive material to form via 435. A contact pad 441/440 can be formed over the via 430/435. In some embodiments, a combination of techniques can be used, with some contact pads being coupled to the aluminum pad 425 and other contact pads being coupled to the metal layer 420. In some embodiments, both techniques can be used to achieve an electrically identical signal at the contact pad 441 and contact pad 440. In some embodiments, the structure can mix use of vias 430 and 435 on a connector-by-connector basis.

Subsequently, the structure 405 can be bonded to the structure 410, using any of the bonding techniques described herein, including the hybrid bonding as discussed above with respect to FIG. 17.

Figure 19:
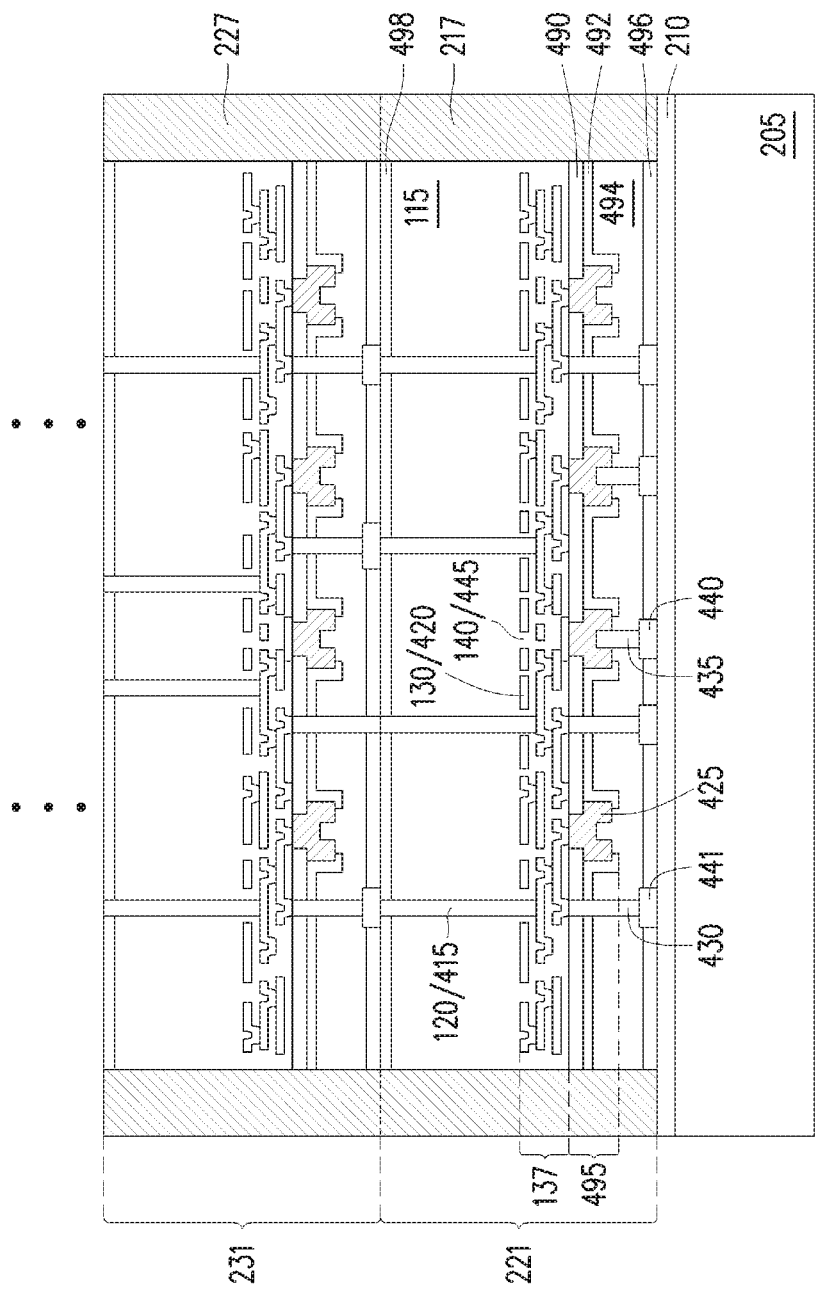
FIG. 19 illustrates a magnified portion of a die stack, in accordance with some embodiments.

FIG. 19 illustrates a magnified portion of FIG. 15 that shows layer 221 from one of the die stacks, e.g., 102a. In some embodiments layer 221 may be a portion of processed wafer 111. Vias 120/415 are illustrated as being coupled to a metallization layer 130/420. In some embodiments vias 120/415 may be electrically isolated from the metallization layer 130/420. Metallization layer 130/420 is illustrated as being a part of interconnect 137 and is formed of alternating layers of conductive material and insulating material, such as insulating material 140/445. Vias 430 may connect to interconnect 137 or another metal feature which is electrically coupled to aluminum pad 425 on one end and contact pad 441 on the other end. In some embodiments, vias 435 may connect directly to an aluminum pad 425 on one end and contact pad 440 on the other end.

Aluminum pad 425 may be coupled to interconnect 137. A passivation layer 490 may be formed over interconnect 137. An opening may be formed in passivation layer 490 to expose a metal contact coupled to interconnect 137 and aluminum pad 425 formed therein. Aluminum pad 425 may be formed from a patterned metal layer (not shown). Another passivation layer 492 may be formed over aluminum pad 425 and the aluminum pad 425 revealed through an opening formed in passivation layer 492. The process of forming aluminum pads 425 in connector layer 495 may be done, for example, for the purposes of known good die (KGD) testing. Subsequent to KGD testing, an insulating material 494 may be formed over the aluminum pads 425. Aluminum pads 425 and insulating material 494 may be formed as part of the processing of wafer 110, such as discussed above with respect to FIG. 1 or thinned processed wafer 111, such as discussed above with respect to FIG. 3, for example.

In some embodiments, a die attach film 496 may comprise insulating material selected such that a fusion bond can be formed between die attach film 496 and released layer 210. In some embodiments, die attach film 496 may comprise a suitable adhesive layer, such as discussed above with respect to release film 210 of FIG. 2. Similarly, an insulating layer 498 may be formed over layer 221, and selected such that a fusion bond can be formed between insulating layer 498 of layer 221 and die attach film 496 of layer 231.

Figure 20:
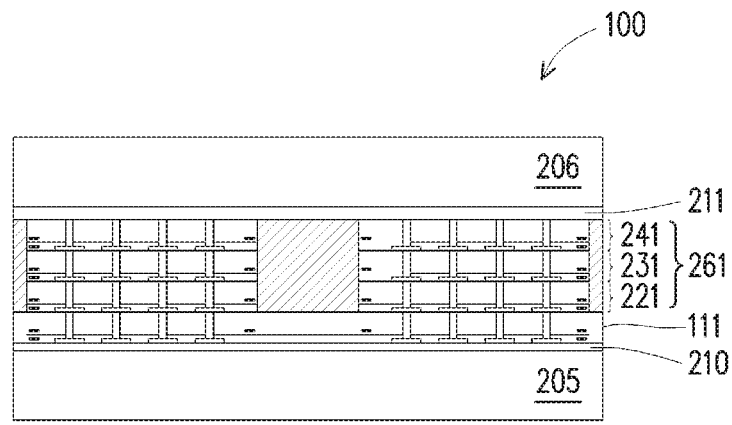
FIGS. 20 through 24 illustrate intermediate steps in a process of forming a die stack where connectors are formed on a front side of the die stack, in accordance with some embodiments.

FIGS. 20 through 24 illustrate a die stack according to some embodiments where connectors are formed on a front side of the die stack. FIG. 20 illustrates a die stack following the step illustrated in FIG. 9. A carrier 206 may be attached to the backside of the die stack 100 by a release layer 211. The carrier 206 may include materials similar to carrier 205 which are not repeated. Release layer 211 may include materials similar to release layer 210. For example, release layer 211 may be a dielectric or insulating layer provided to fusion bond carrier 206 to the die stack 100.

Figure 21:
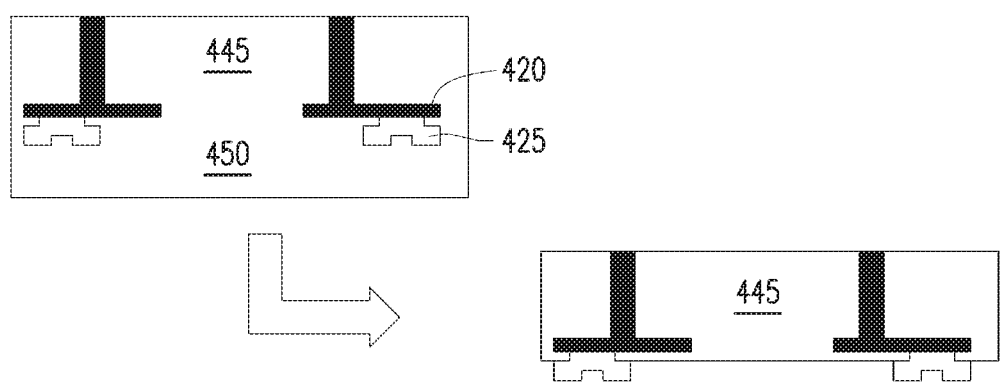

Referring to FIG. 21, following the attachment of the carrier 206, the carrier 205 may be removed using a suitable process. In some embodiments, release layer 210 may be exposed to UV light, thereby degrading an adhesive and allowing the carrier 205 to come free. In some embodiments, carrier 205 may be removed by grinding or etching, or the like. Following the removal of carrier 205, contact pads 425 (or 125 of FIG. 1) may be exposed. In some embodiments, insulating material 450 (or 494 of FIG. 19) may be recessed by a mechanical process such as CMP or grinding, or by etching, or by a combination thereof, to expose the contact pad 425/125.

Figure 22:
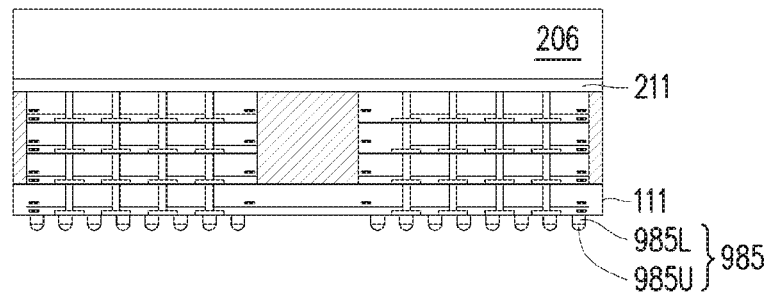

Referring to FIG. 22, connectors 985 are formed on the front side of the die stack. In some embodiments, connectors 985 are formed on contact pad 425/125. In some embodiments, connectors 985 are formed on a front side of the processed wafer 511. Connectors 985 can be formed using any suitable process and comprise various configurations. In some embodiments, the connectors 985 may be controlled collapse chip connection (C4) bumps, micro-bumps, solder balls, or the like. In some embodiments, connectors 985 can be coupled to the exposed contact pads 425. In other embodiments, openings (not shown) may be made in the front side of the processed wafer 111, the opening exposing metal features of the processed wafer 111. Connectors 985 are formed on the contact pads or in the openings. In some embodiments, an under bump metallurgy (UBM) layer can be formed on the contact pads or in the openings prior to the formation of the connectors 985. In the illustrated embodiment, the connectors 985 have lower portions 985L comprising a conductive material and upper portions 985U comprising a solder material. The lower portions 985L and the upper portions 985U may be also referred as conductive pillars 985L and solder caps 985U, respectively.

Connectors 985 can be coupled to conductive features of the processed wafer 111. Such conductive features can include for example an interconnect 137 (see FIG. 19), vias, such as via 120, 130, 415, 420, 430, or 435 (see FIG. 19), or other metal traces or lines.

Figure 23:
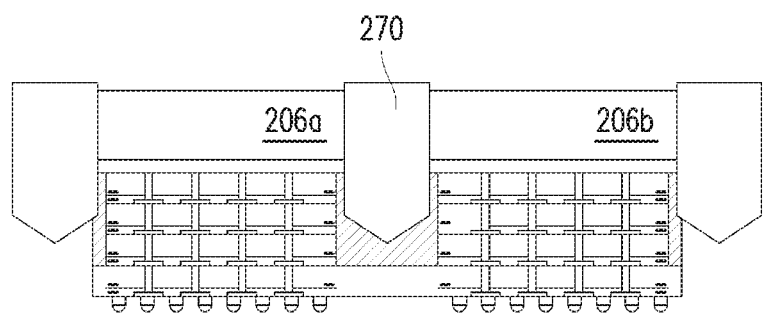
Figure 24:
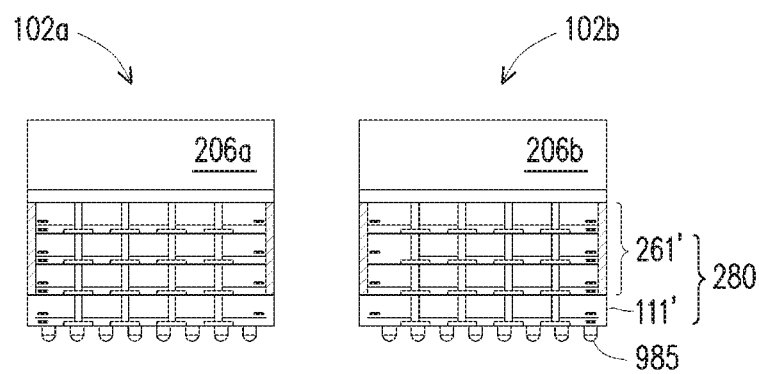

Referring to FIG. 23, the stacked chips may be singulated using processes and materials such as those discussed above with reference to FIG. 10, and are not repeated. Referring to FIG. 24, the singulated die stacks 102a and 102b are illustrated, in accordance with some embodiments. Optionally, the carrier 206a and 206b may be removed, using a suitable technique.

Figure 25:
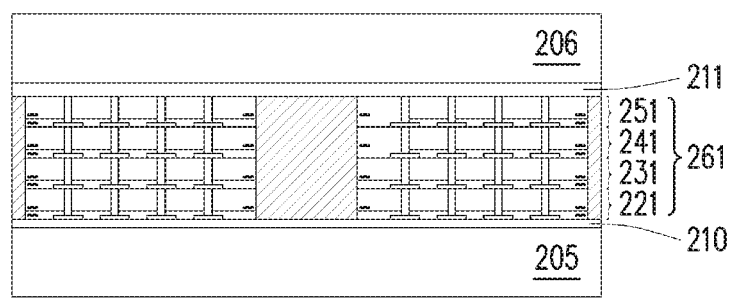
FIGS. 25 through 27 illustrate intermediate steps in a process of forming a die stack where connectors are formed on a front side of the die stack, in accordance with some embodiments.
Figure 26:
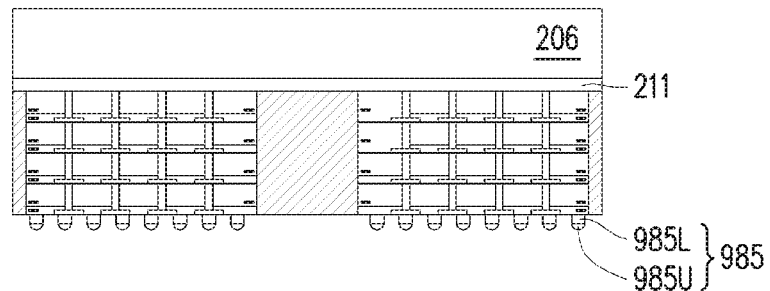
Figure 27:
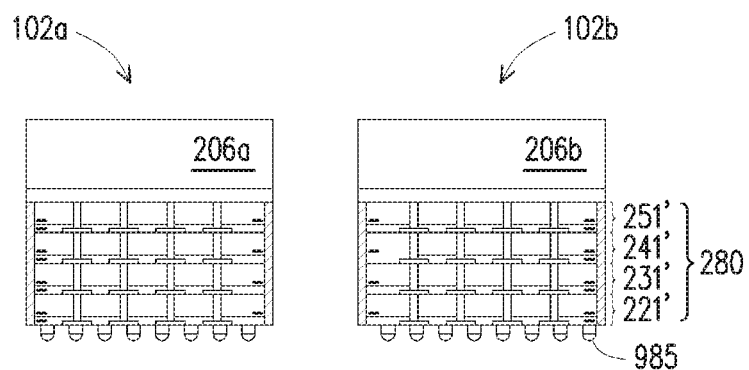

FIGS. 25 through 27 illustrate a die stack according to some embodiments where connectors are formed on a front side of the die stacks. FIG. 25 illustrates a die stack following the step illustrated in FIG. 15. A carrier 206 may be attached to the backside of the die stack 100 by a release layer 211. The carrier 206 may include materials similar to carrier 205 which are not repeated. Release layer 211 may include materials similar to release layer 210. For example, release layer 211 may be a dielectric or insulating layer provided to fusion bond carrier 206 to the die stack 100.

Referring to FIG. 26, following the attachment of the carrier 206, the carrier 205 may be removed using a suitable process. In some embodiments, release layer 210 may be exposed to UV light, thereby degrading an adhesive and allowing the carrier 205 to come free. In some embodiments, carrier 205 may be removed by grinding or etching, or the like. Following the removal of carrier 205, contact pads 425 (or 125 of FIG. 1) may be exposed, such as discussed above with respect to FIG. 21.

Connectors 985 are formed on the front side of the die stacks using processes and materials such as those about with respect to FIG. 22, and are not repeated. Connectors 985 may be coupled to conductive features of the chip layer 221. Such conductive features can include for example an interconnect 137 (see FIG. 19), vias, such as via 120, 130, 415, 420, 430, or 435 (see FIG. 19), or other metal traces or lines.

Referring to FIG. 27, the stacked chips may be singulated using processes and materials such as those discussed above with reference to FIG. 10, and are not repeated. The singulated die stacks 102a and 102b are illustrated, in accordance with some embodiments. Optionally, the carrier 206a and 206b may be removed, using a suitable technique.

FIGS. 28 through 44 illustrate various intermediate steps in creating an application package 500, in accordance with some embodiments. The application package 500 can be formed to include a combination of memory die stacks, logic die stacks, thermal chip stacks, and other devices, such as a power controller, wireless radio device, other memory, other logic, sensors, and so forth.

Figure 28:
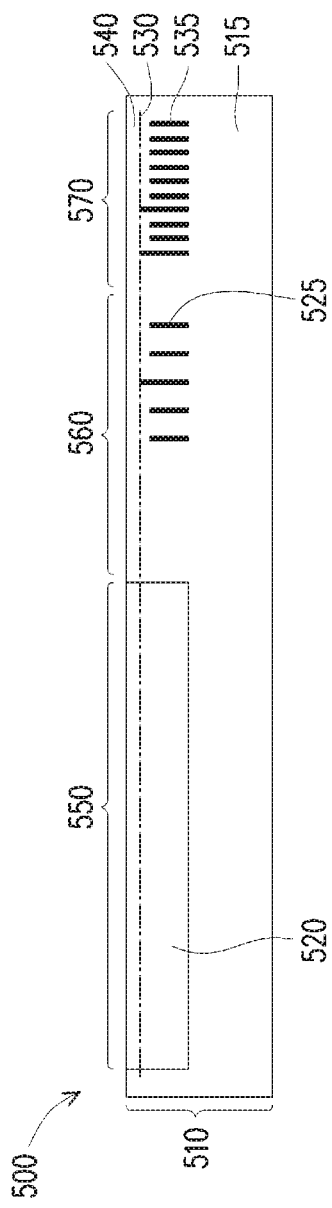
FIGS. 28 through 44 illustrate intermediate steps in a process of forming a packaged device, in accordance with some embodiments.

Referring to FIG. 28, application package 500 comprises a processed wafer 510 comprising a substrate 515 having devices formed therein. Substrate 515 can be formed of silicon, although it may also be formed of other group III, group IV, and/or group V elements, such as silicon, germanium, gallium, arsenic, and combinations thereof. The substrate may also be in the form of silicon-on-insulator (SOI). The SOI substrate may comprise a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like.

Processed wafer 510 can include several packages, including other application packages 500 which are formed in accordance with the description below. The multiple application packages 500 can all be formed at the same time. In some embodiments, processed wafer 510 includes packages of different types or designs than the illustrated application packages 500. In some embodiments, processed wafer 510 includes packages including different variations of the embodiments of application packages 500 discussed below.

Application package 500 can comprise a system on a chip that includes a logic area 550, a memory area 560, and a thermal dissipation area 570. In some embodiments, thermal dissipation area 570 is omitted. In such embodiments, it can be understood that any description below relating to the thermal dissipation area 570 does not apply.

Still referring to FIG. 28, processing unit 520 can include a logic device, such as a central processing unit or graphics processing unit or other suitable processor formed in the substrate 515. Processing unit 520 can be formed using any suitable technique. The particular strategy for forming processing unit 520 is not critical to the use and understanding of the present application. In some embodiments, the processing unit 520 can be a separate die embedded in processed wafer 510. Processing unit 520 can include transistors, such as NMOS, PMOS, and CMOS transistors, as well as other devices and interconnections.

Vias 525 can be formed in substrate 515 adjacent to the processing unit 520. In some embodiments, vias 525 can be formed as part of a memory die formed in wafer 510. In some embodiments, vias 525 can be formed as a part of a memory die region for receiving a memory die. Vias 525 can be conductive vias which are electrically coupled to an interconnect 530. In some embodiments, one or more of the vias 525 can be dummy vias, i.e., floating or not electrically coupled to any device or metal feature in substrate 515. Vias 525 can be formed using processes and materials similar to those described above with respect to the vias 120 of FIG. 1.

Interconnect 530 can be coupled to processing unit 520, vias 525, and vias 535. Interconnect 530 can provide connections between vias 525 and processing unit 520, between processing unit 520 and connectors or connector pads, between processing unit 520 and other devices formed in substrate 515, between vias 525 and connectors or connector pads, between vias 525 and other devices formed in substrate 515, and so forth.

Interconnect 530 can be formed using processes and materials such as those described above with respect to the interconnect 130 of FIG. 1. Insulating material 540 may be formed within and over the interconnect 530 to electrically separate conductive elements of interconnect 530. Insulating material 540 may be formed by processes and materials such as those described above with respect to insulating material 140 of FIG. 1.

Still referring to FIG. 28, vias 535 in the thermal dissipation area 570 can, in some embodiments, be conductive vias, i.e., vias coupled to the interconnect 530 or another conductive feature. In some embodiments, vias 535 are dummy vias, similar to the dummy vias 525, described above. In some embodiments, vias 535 can include a combination of dummy vias and conductive vias. Vias 535 can be formed using processes and materials similar to those described above with respect to the vias 120 of FIG. 1.

Vias 525/535/546 are thermally conductive and may be formed for a primary purpose of conducting heat away from heat generating devices in the substrate 515. Thermally conductive vias 525/535/546 may traverse a substantial portion of the substrate 515, such as the entire depth of the substrate or the entire depth of a portion of the substrate 515 having active and passive devices formed therein. Embodiments can also contain other vias (not shown) used for other purposes in the substrate 515.

Figure 29:
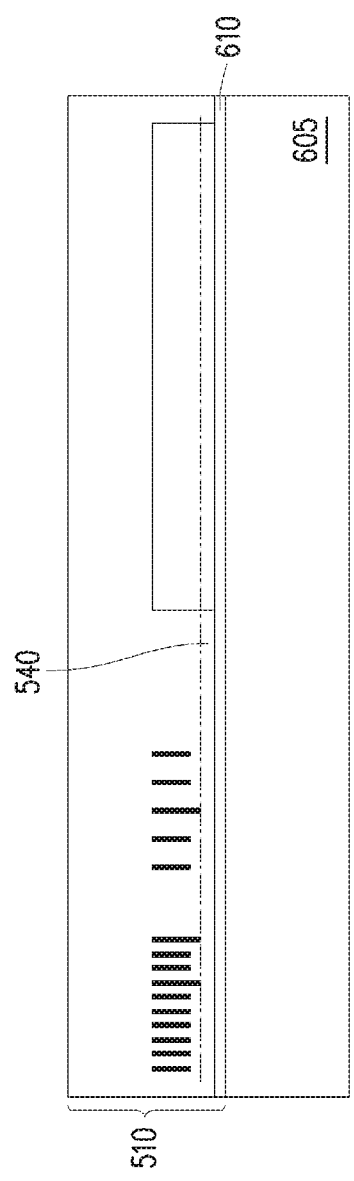

Referring to FIG. 29, the workpiece/processed wafer 510 can be flipped over and attached to a carrier 605. Generally, carrier 605 provides temporary mechanical and structural support various features (e.g., processed wafer 510) during subsequent processing steps. In this manner, damage to the device dies is reduced or prevented. Carrier 605 may comprise, for example, glass, ceramic, bulk silicon, and the like. In an embodiment, release layer 610 is used to attach die processed wafer 510 to carrier 605. In some embodiments, carrier 605 may be substantially free of any active devices and/or functional circuitry. In some embodiments, carrier 605 may comprise bulk silicon, and processed wafer 510 may be attached to carrier 605 by a dielectric release layer 610. In some embodiments, the carrier 605 may comprise a support tape.

Release layer 610 can comprise materials and processes in accordance with those discussed above with respect to release layer 210.

In some embodiments, attaching the processed wafer 510 to the carrier 605 uses a fusion bonding process where an insulating layer of the processed wafer 510 (e.g., insulating layer 540 or a subsequently deposited dielectric layer) is directly bonded to a dielectric bonding layer 610 or to a dielectric surface of the carrier 605 to form a insulator-to-insulator bond.

Figure 30:
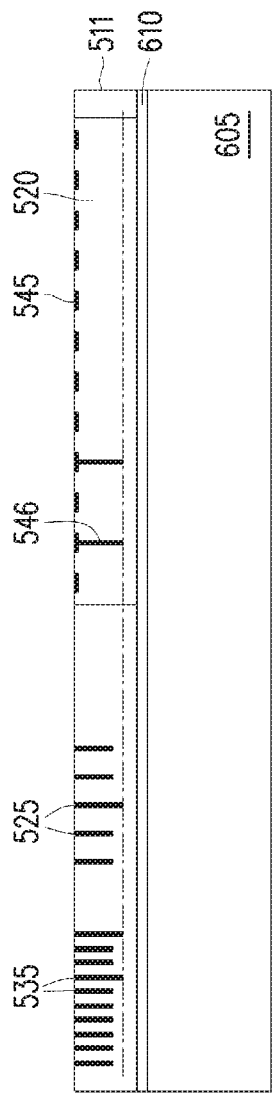

Referring to FIG. 30, in some embodiments the processed wafer 510 is thinned to create processed wafer 511. Thinning can be done by a CMP process, etching, or other suitable process. After thinning, the processed wafer 111 can be about 10 to 50 μm thick, for example, about 20 μm thick. Thinning exposes vias 525 and vias 535 and also reduces the thickness to provide better heat dissipation and take less space. In some embodiments, thinning can also expose metal features (not shown) on the processing unit 520. These metal features may or may not be electrically connected to devices within the processing unit 520. In some embodiments, contacts or contact pads 545 can be formed on the processing unit 520. In some embodiments, the contact pads 545 are coupled to the exposed metal features. In some embodiments, the contact pads 545 are formed using processes and materials similar to those described above in the formation of contact pads 125 in FIG. 1. The contact pads 545 can be coupled to conductive features embedded within the processing unit 520, such as vias 546, traces, and metal lines (e.g. 530).

Figure 31:
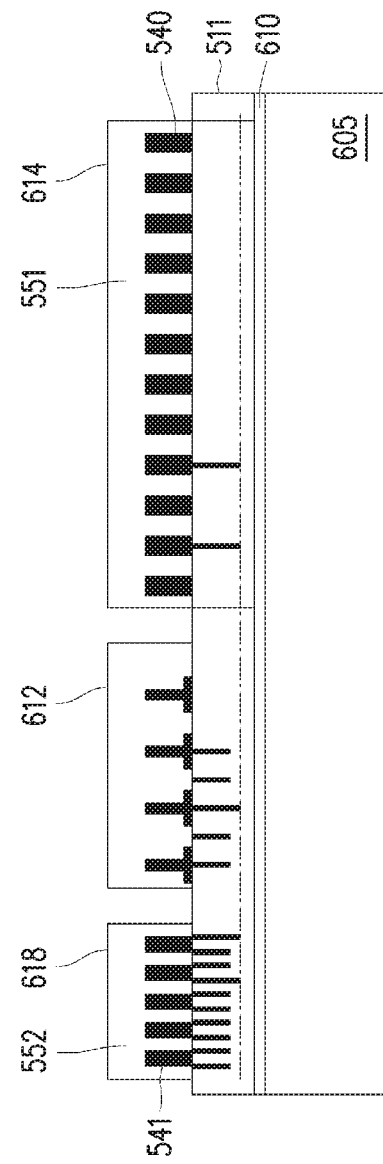

Referring to FIG. 31, dies 612, 614, and 618 are bonded to processed wafer 511. In some embodiments, the dies 612, 614, and 618 are attached to the processed wafer 511 using, for example, a pick and place apparatus. In other embodiments, the dies 612, 614, and 618 may be attached to the processed wafer 511 manually, or using any other suitable method.

Die 612 can be a memory die or other type of die. For example, die 612 can be a memory die similar to the integrated circuit packages 101a or 101b, discussed above in relation to FIG. 2. Die 614 can be a thermal chip comprising thermally conductive vias 542 and a surrounding material 552. In some embodiments, die 618 is a thermal chip similar to die 614 comprising thermally conductive vias 541 and a surrounding material 551. In other embodiments, die 618 is another type of device die, such as a sensor, power converter, radio, or the like. The use of dies 612, 614, and 618 are merely illustrative and is not intended to be limiting. It should be understood that additional dies can be attached in other areas of the processed wafer 511. Dies 612 and 614 can be referred to as heat dissipating structures.

In some embodiments, in a separate process, thermal chips 614 and 618 can be made by forming vias, such as via 542 or 541 in a wafer comprised of the surrounding material 551 or 552, respectively. The wafer can be singulated into thermal chips, such as thermal chips 614 and 618. The wafer of the thermal chip can comprise a semiconductor material or an insulating material. In some embodiments, the wafer of the thermal chips 614 and 618 can comprise a semiconductor material that is one of the materials described above with respect to the substrate material 115. In some embodiments, the wafer of the thermal chips 614 and 618 can comprise an insulating material that is one of the materials described above with respect to the carrier 205 of FIG. 2.

The vias 542/541 can be formed in the surrounding material 551/552 by depositing a mask over the surrounding material, patterning the mask, etching recesses into the surrounding material 551/552, depositing a seed layer, electroplating the seed layer to fill the recess and create the vias, and removing the mask. In some embodiments a second mask can be used over the seed layer to prevent the electroplating of the seed layer in places other than the recess. In some embodiments, other suitable processes and materials can be used to form the vias 542/541. In some embodiments, contact pads (not shown) can be formed over the vias of the thermal chips 614 and 618. Contact pads can be formed, for example, using processes and materials such as described above with respect to FIG. 1 and FIG. 18 and is not repeated.

Still referring to FIG. 31, in some embodiments, the dies 612, 614, and 618 can be hybrid bonded to processed wafer 511 by aligning and directly bonding the contacts of the die 612 to vias 525, vias 542 to contacts pads 545 or vias 546, and vias 541 to vias 535. It should be understood that the bonding of the vias and contacts illustrated in FIG. 31 are merely an example, and other configurations of hybrid bonded elements are contemplated. Hybrid bonding can be carried out using processes and materials as described above with respect to FIG. 17 which are not repeated, including any combination of direct bonding of vias and contacts. Also as discussed above, as a result of the hybrid bonding, fusion bonding of insulating materials on the dies 612, 614, and 618 can also be achieved. Thus, no underfill is needed between the dies 612, 614, 618 and the processed wafer 511.

In some embodiments, die 612 is bonded to vias 525, die 614 is bonded to contacts pads 545 or vias 546, and die 618 is bonded to vias 535 by forming a eutectic-type connector or conductive pillar over the vias 525/535 of the processed wafer 511, bringing the dies 612, 614, and 614 together with the processed wafer 511 after aligning the corresponding contacts, and reflowing the eutectic materials to form a physical and electrical coupling. Alternatively, a eutectic-type connector or conductive pillar can be formed on the dies 612/614/618, or on both the dies 612/614/618 and the processed wafer 511. In such embodiments, an underfill material can be used between the dies 612/614/618 and processed wafer 511, or alternatively a gap-fill material, such as described below, can provide underfill capabilities.

Figure 32:
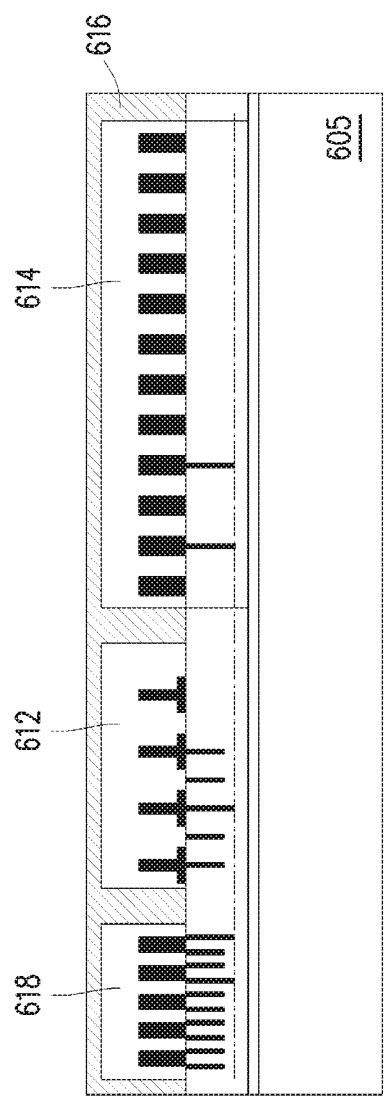

Referring to FIG. 32, a gap-fill material 616 is formed over the workpiece to substantially fill the spaces between the dies 612, 614, and 618. The processes and materials can be the same as described above with respect to the gap-fill material of FIG. 5 and are not repeated.

Figure 33:
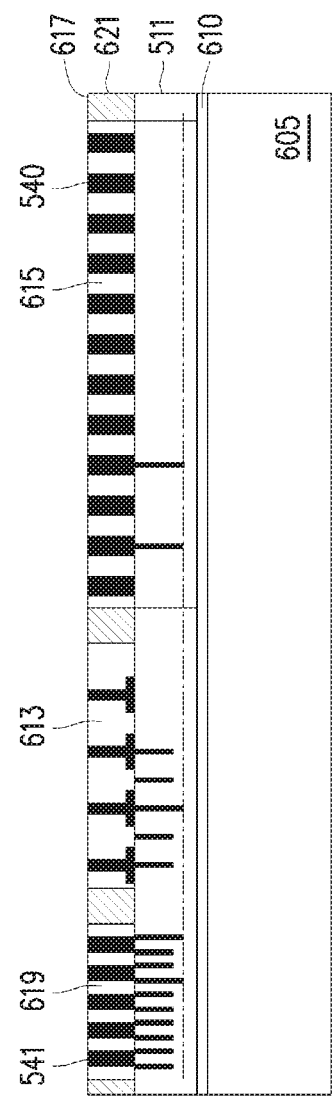

Referring to FIG. 33, the gap-fill material 616 and dies 612, 614, and 618 can be thinned to create gap-fill material 617 and thinned dies 613, 615, and 619. Thinning can be done by a CMP process, grinding, etching, or other suitable process. Thinning exposes vias 120 in die 613, vias 542 in die 615, and vias 541 in die 619, and also reduces the thickness of dies 613/615/619 to provide better heat dissipation and take less space. After thinning, the dies 613/615/619 can be about 10 to 50 μm thick, for example, about 20 μm thick. In some embodiments, a top surface of the gap-fill material 617 and top surfaces of the dies 613/615/619 are substantially co-planar within process variations. The layer 621 comprises the combined gap-fill material 617 and thinned dies 613/615/619.

Figure 34:
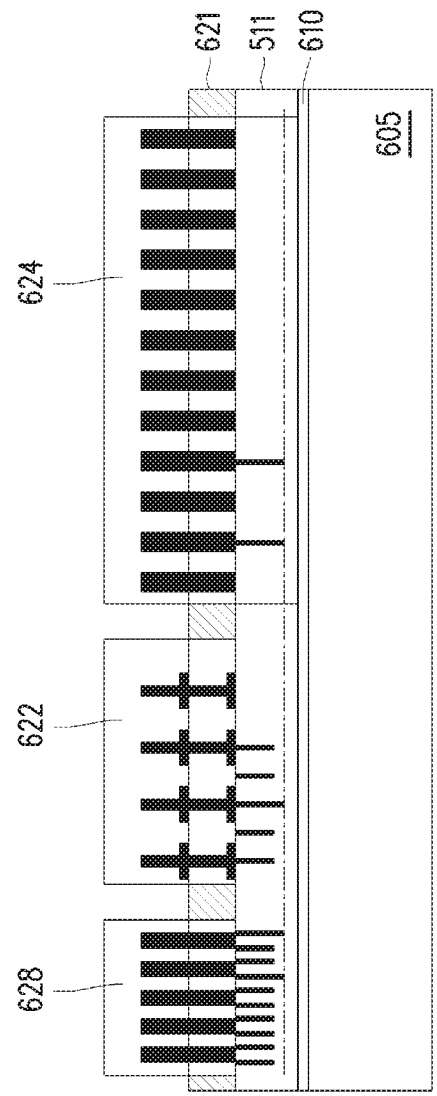

Referring to FIG. 34, in some embodiments, dies 622, 624, and 628 are bonded to dies 613, 615, and 619, respectively, to form a die stack. In some embodiments, dies 622, 624, and 628 can be the same type of device, chip, or die as their respective counterpart dies 613, 615, and 619. In some embodiments, one or more of dies 622, 624, and 628 can be a different type of device, chip, or die than their respective counterpart dies 613, 615, and 619. Dies 622, 624, and 628 can be bonded to dies 613, 615, and 619, respectively, in like manner as dies 612, 614, and 618 are bonded to processed wafer 511, as described above with respect to FIG. 31, and is not repeated here. In particular, dies 622 can be hybrid bonded to dies 613 by a direct bonding of contact pads 125 of dies 622 and vias 120 or contact pads of dies 613. Similarly, dies 624 can be bonded to dies 615 by a direct bonding of vias 542 of dies 624 and vias 542 of dies 615. Likewise, dies 628 can be bonded to dies 619 by a direct bonding of vias 541 of dies 628 and vias 541 of dies 619. In some embodiments, a fusion boding of insulating materials of each of the bonded dies can also occur.

Figure 35:
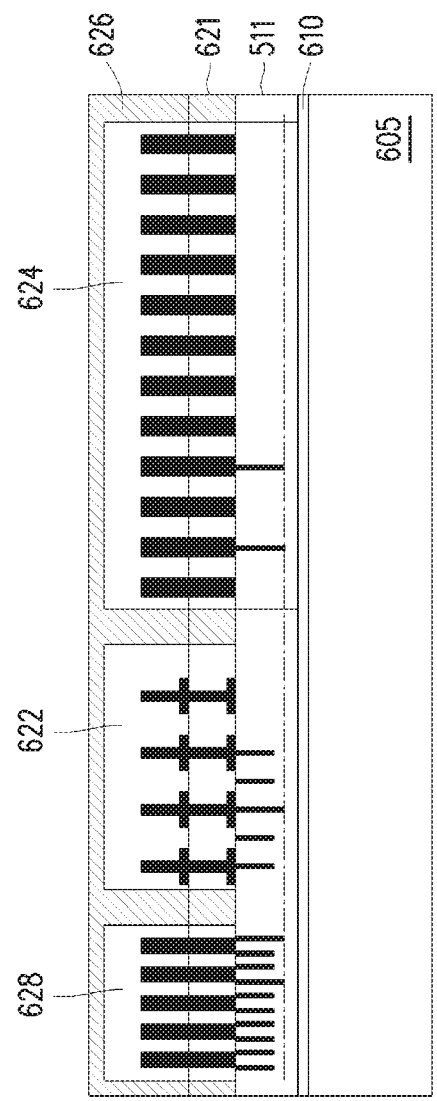

Referring to FIG. 35, a gap-fill material 626 is formed over the workpiece to substantially fill the spaces between dies 622/624/628. The process and materials is the same as those discussed above in relation to FIG. 32 for the formation of gap-fill material 616, and is not repeated.

Figure 36:
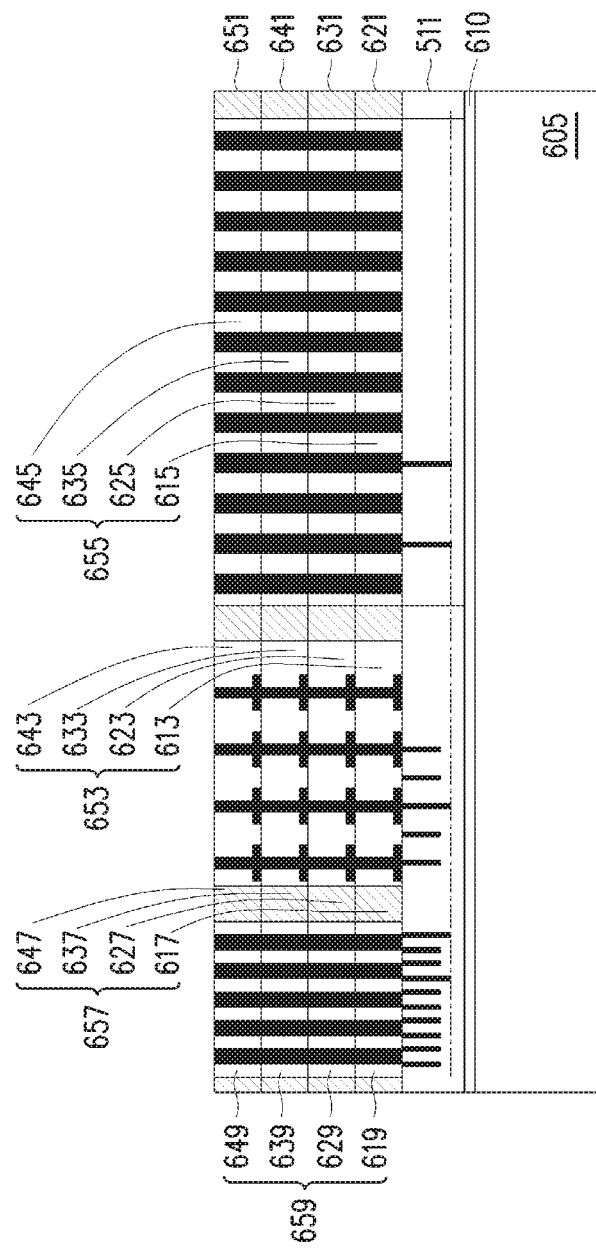

Referring to FIG. 36, in some embodiments, the process of thinning and attaching additional dies of FIGS. 33-35 are repeated until a desired die stack configuration is achieved. In some embodiments, a memory cube 653 can be formed by a four layer stack of memory dies comprising memory dies 613, 623, 633, and 643. In some embodiments, a corresponding thermal chip stack 655 can be formed by a four layer stack of thermal chips comprising thermal chips 615, 625, 635, and 645. In some embodiments, a corresponding thermal chip stack 659 can be formed by a four layer stack of thermal chips comprising thermal chips 619, 629, 639, and 649. In some embodiments, the processed gap-fill material 657 can include distinguishable layers 617, 627, 637, and 647. In some embodiments, the processed gap-fill material 657 will be continuous throughout the die layers and indistinguishable in a cross-section view. Thermal chip stacks 655 and 659 can be referred to as heat dissipating structures.

In some embodiments, the die stack 655 or 659 can comprise other types of devices. In some embodiments, additional layers can be included in a like manner as described herein with respect to any of stacks 653, 655, and 659. Although the number of layers over processed wafer is depicted as the four layers 621, 631, 641, and 651, it should be understood that more or fewer layers can be included.

In some embodiments, the die stacks, i.e., memory cube 653, thermal chip stack 655, and thermal chip stack 659, may be formed by separate processes and attached to processed wafer 511. For example, memory cube 653 can be built using the processes described above with respect to packages 102a or 102b of FIG. 1-11 or 12-16. Similar processes can also be used to form thermal chip stacks 655 and 659 by substituting the layer-by-layer processes and materials for forming the thermal chip stacks 655 and 659 described above into the processes illustrated in FIG. 1-11 or 12-16. In some embodiments, a single layer thermal chip of sufficient height can be used.

Figure 62A:
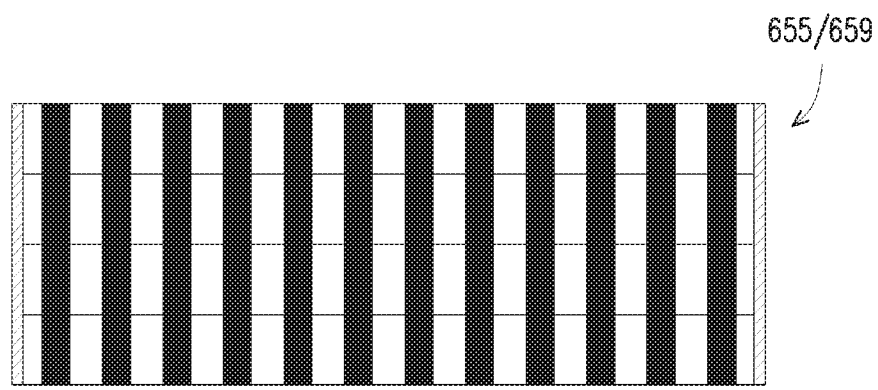
FIGS. 62A through 63D illustrate example heat dissipating structures, in accordance with various embodiments.
Figure 62B:
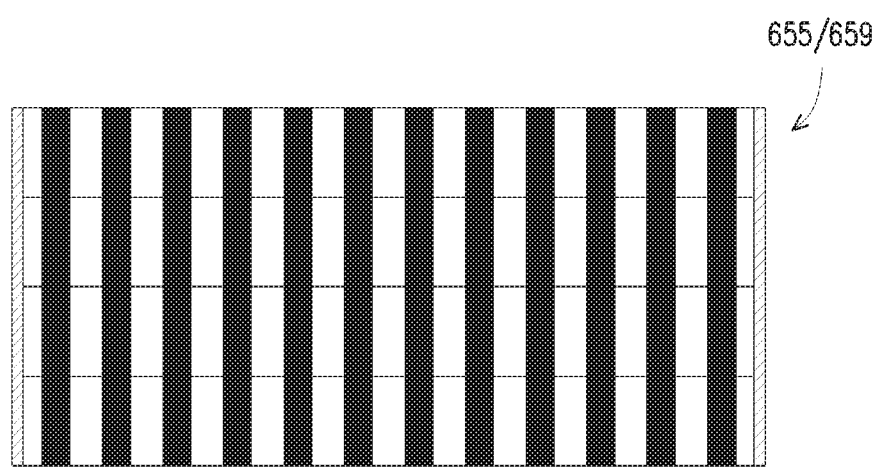
Figure 62C:
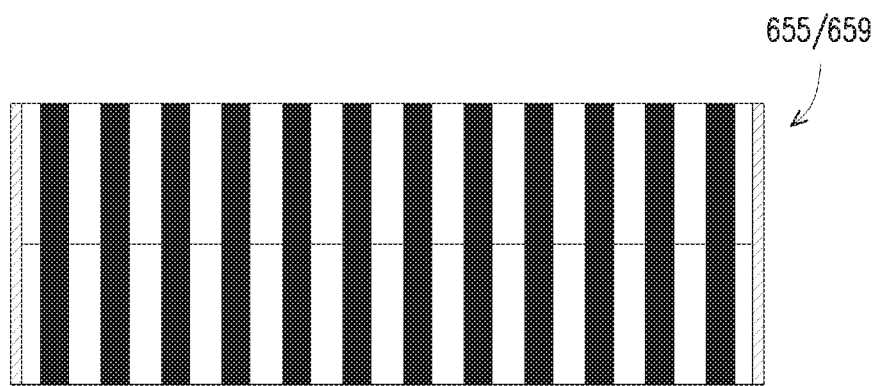
Figure 62D:
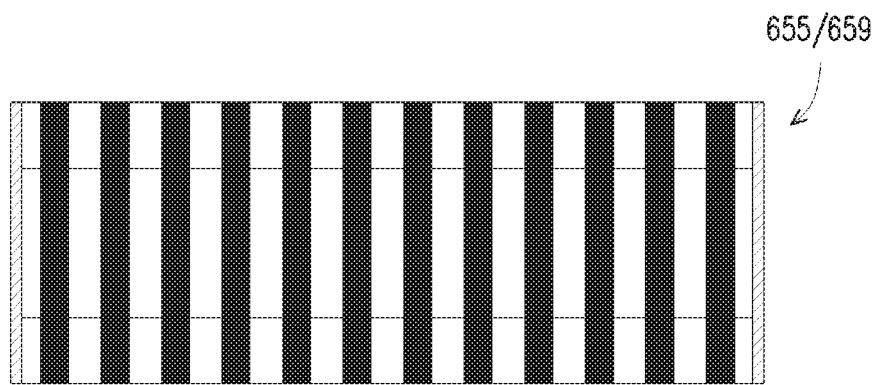

FIGS. 62A-62D illustrate various embodiments for a separately formed thermal chip stack, such as thermal chip stack 655 or 659, which is then attached to processed wafer 511. Because the thermal chip stack 655 and 659 has no active or passive devices formed therein, the height of the individual layers is not critical. FIG. 62A illustrates a separately formed thermal chip stack, in accordance with some embodiments, which is substantially similar to the thermal chip stack 655 or 659 formed layer by layer, discussed above. FIG. 62B illustrates a separately formed thermal chip stack which has an overall height greater than a desired height, which can be thinned after bonding according to the described thinning process above. FIG. 62C illustrates a separately formed thermal chip stack comprising two layers of approximately the same height. FIG. 62D illustrates a separately formed thermal chip stack comprising three layers of varying heights. It should be understood that any number of layers can be used and that these embodiments can be combined in any combination.

Figure 37:
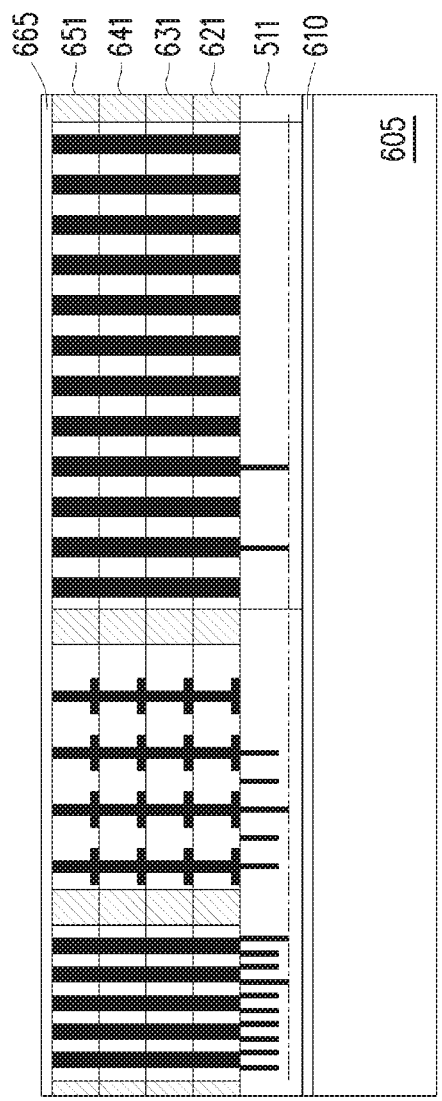

Referring to FIG. 37, in some embodiments, a metal mask 665 can be formed over the workpiece. The metal mask 665 may be a hard mask and may be referred to as metal hard mask 665 hereafter. The optional metal hard mask 665 can be used to further conduct heat from the thermal chip stacks 655 and 659 as well as the memory cube 653. The metal hard mask 665 can be formed in multiple layers, such as a first seed layer and one or more subsequent material layers. The seed layer (not shown) can be made of copper (Cu), tungsten (W), gold (Au), silver (Ag), aluminum, (Al), lead (Pb), tin (Sn), alloys of the same, or the like, and may be formed using an electro-plating or electroless plating process, ALD, PVD, sputtering, the like, or a combination thereof. The one or more subsequent material layers can be formed using similar processes and materials as the seed layer.

Figure 38:
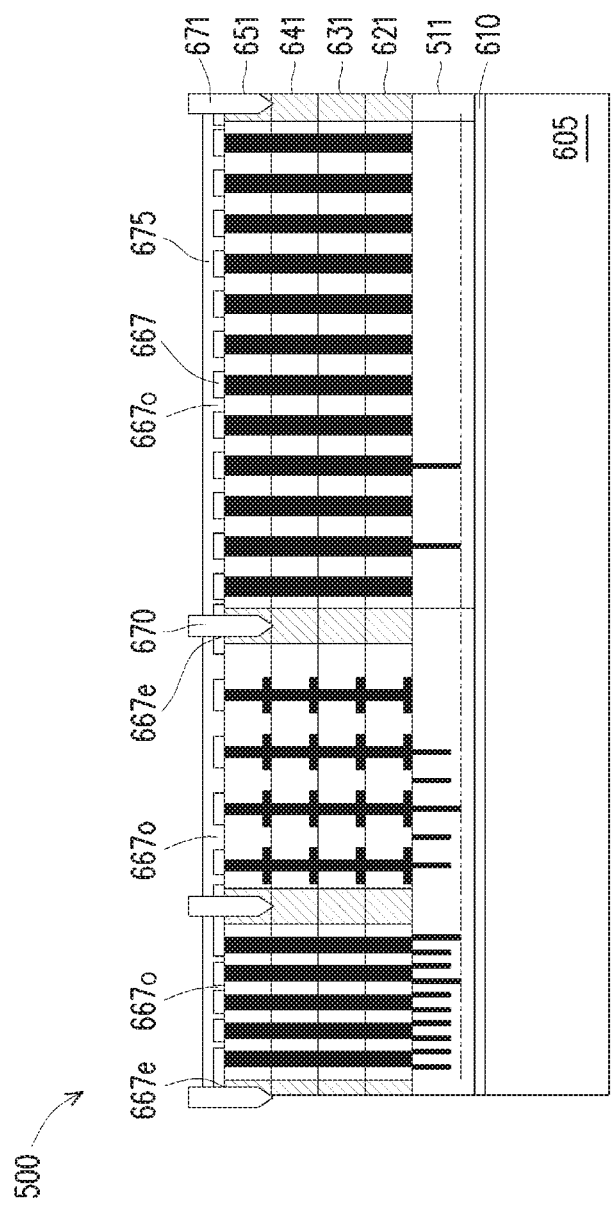

Referring to FIG. 38, in some embodiments where a metal hard mask 665 is used, the metal hard mask 665 can be patterned to form a patterned metal hard mask 667. The metal hard mask 665 can be patterned using any suitable technique, such as, a photolithographic technique. Generally, photolithography techniques involve depositing a photoresist material (not shown), which is subsequently irradiated (exposed) and developed to remove a portion of the photoresist material. The remaining photoresist material can, in some embodiments, be used as a mask to etch exposed materials or, in other embodiments, prevent the formation of other materials thereon. The photoresist can then be removed.

In some embodiments, metal hard mask 665 can be formed as a patterned metal hard mask 667 by first forming a blanket seed layer, forming a photoresist material over the seed layer, patterning the photoresist layer, and forming metal materials in the openings of the seed layer by plating, such as electroplating or electroless plating, or the like. Subsequently, the photoresist is removed and the exposed seed layer is stripped using a wet or dry etch.

In some embodiments, such as illustrated in FIG. 38, if a metal hard mask 665 is used, it is at least patterned to form openings 667o to expose the gap-fill material layers 657 (see FIG. 36). In addition, openings 667o can be formed over the surrounding material 551/552 of the top layer 645/649 of the thermal chip stacks 655/659. In some embodiments, openings can also be formed over the substrate 115 or insulating material 140 of the top layer 643 of the memory cube 653.

Figure 39:
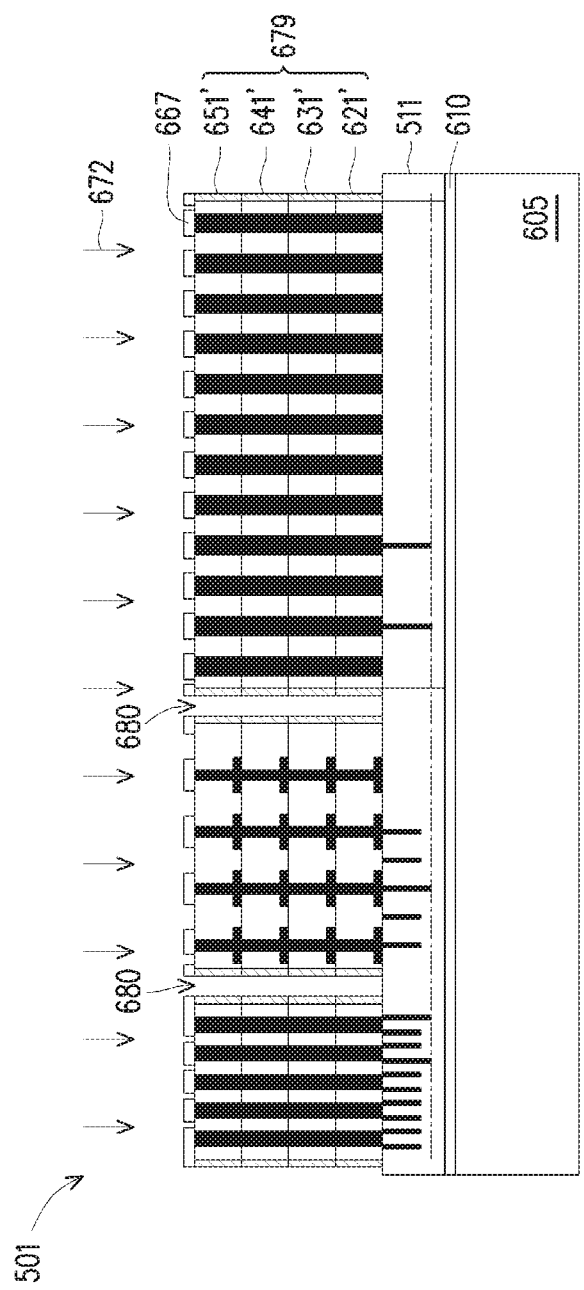

Still referring to FIG. 38, the gap-fill material layers 657 between each of the stacks 653, 655, and 659 are cut down to the surface of the processed wafer 511, using a cutting technique 670 to form openings 680 (see FIG. 39). Cutting technique 670 can include a dry etch, wet etch, anisotropic etch, or plasma etch using a suitable etchant for the gap-fill material. Cutting technique 670 can include a laser making multiple passes to achieve a desired depth profile. Cutting technique 670 can include a mechanical process, such as a saw set to cut to a desired depth. A combination of the above described cutting techniques 670 can also be used. It may be desirable to use a plasma etching technique to achieve a smooth wall profile of the gap-fill material.

Still referring to FIG. 38, the multiple packages formed from the processed wafer 511, such as application packages 500, are singulated from the workpiece, resulting in a singulated application package 501 (see FIG. 39). Singulation 671 can occur by any acceptable process, including plasma dicing, laser dicing, mechanical saw, or a combination thereof. Singulation occurs through the non-package regions (outside 550/560/570 of FIG. 28) on scribe lines or dicing streets of the workpiece. The singulation cuts through the processed wafer 511, down to the release layer 610. In some embodiments, the singulation can continue through the release layer 610 and may continue into or through the carrier 605.

In embodiments where plasma dicing is performed for the singulation 671 or etch or plasma etch is performed for the cutting technique 670, the patterned metal hard mask 667 can be used as a plasma dicing/etch mask prior to the formation of openings 667o. The openings 667e in the patterned mask 667 can be formed prior to plasma dicing/etch to define the areas to be etched or diced.

In some embodiments, one or more masks 675, such as a photoresist, can temporarily be formed over the patterned metal hard mask 667 and over portions of the gap-fill material layers 657 to protect them from etching or plasma dicing. The one or more masks 675 are removed when the cutting and singulation is complete.

An advantage of plasma dicing application dies 501 is that, with the gap-fill material 657, smooth sidewall profiles can be achieved through the plasma dicing. Plasma dicing can be performed using processes and materials such as those described above with respect to FIG. 10, which are not repeated.

Referring to FIG. 39, using the patterned metal hard mask 667, in some embodiments an etching 672 (illustrated by arrows) can be performed to form trenches (681 of FIG. 40) in the surrounding material 551/552 of the thermal chip stacks 655/659. In some embodiments, the substrate 115 or insulating material 140 of the top layer 643 of the memory cube 653 can also be etched at the same time to form trenches therein. In some embodiments, the etching 672 can be performed in multiple steps using protective masks (not shown) to protect areas not being etched, so as to form trenches of different depths.

The singulation 671 and gap-fill cutting 670 discussed above result in openings 680 between the die stacks, and modified layers 621', 631', 641', and 651' resulting in layer structure 679.

Figure 40:
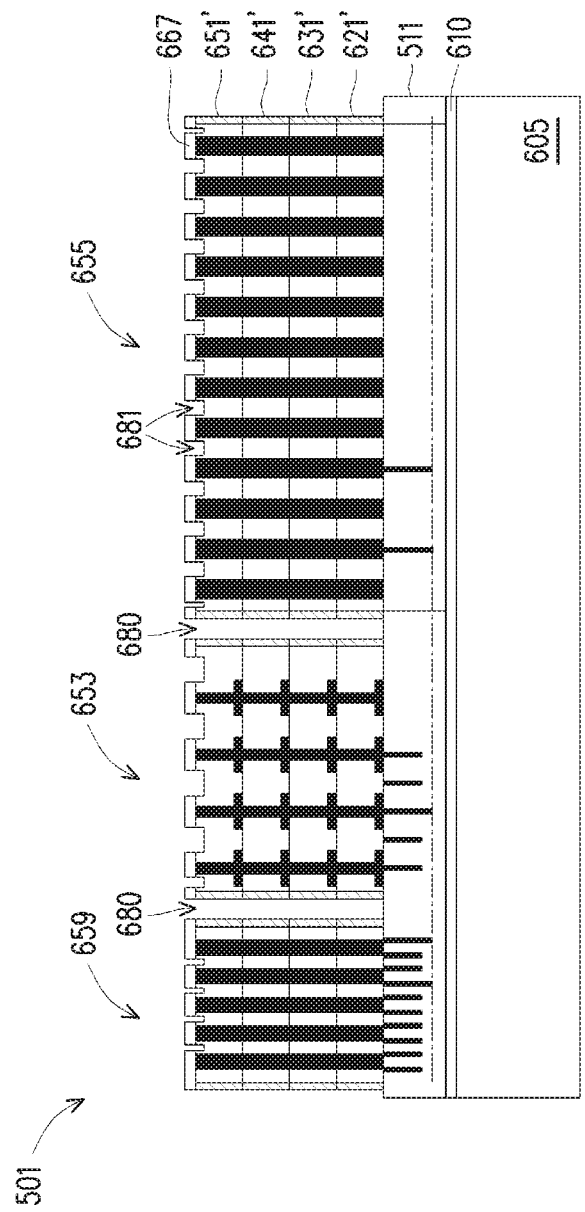

Referring to FIG. 40, the etching 672 forms trenches 681 in the top layer 651'. Trenches 681 can be about 1 μm to about 40 μm deep, such as about 5 μm deep, and may traverse all the way through the surrounding material 551/552 of the top die 651' and into the layers below, such as 641' or 631'. Trenches 681 can aid in heat dissipation by increasing the contact surface area between the thermal chip stacks 655/659 and a thermal interface material (690 of FIG. 42) and can shorten the distance between the thermal interface material and thermally conductive vias. Likewise, trenches 681 in the top layer 643 of the memory cube 653 can also increase surface area and shorten the distance between thermal interface material 690 and thermally conductive vias.

Figure 41:
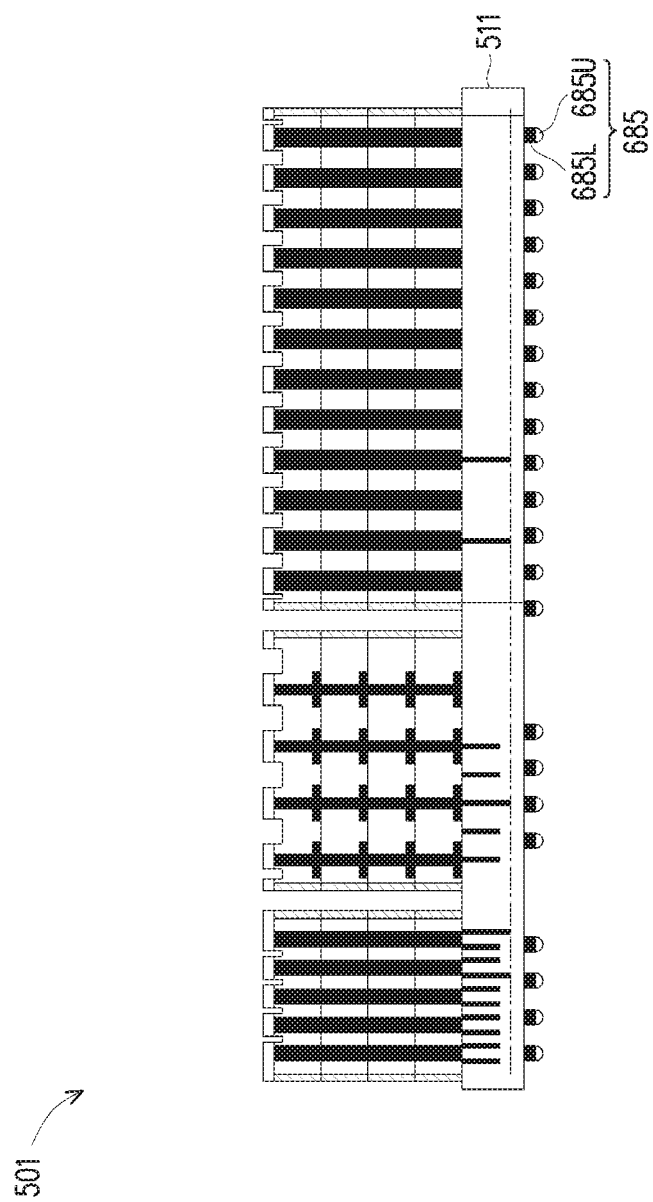

Referring to FIG. 41, following the dicing, the carrier 605 is removed from the package 501. Removing the carrier 505 may include applying UV radiation to release layer 610, a mechanical grinding process, an etch back process, a heating process, combinations thereof, or the like.

Connectors 685 are formed on a front side of the processed wafer 511. Connectors 685 can be formed using any suitable process and comprise various configurations. In some embodiments, the connectors 685 may be controlled collapse chip connection (C4) bumps, micro-bumps, solder balls, or the like. For example, openings (not shown) can be made in the front side of the processed wafer 511, the opening exposing metal features of the processed wafer 511. Connectors 685 are formed in the openings. In some embodiments, an under bump metallurgy (UBM) layer can be formed in the openings prior to the formation of the connectors 685. In the illustrated embodiment, the connectors 685 have lower portions 685L comprising a conductive material and upper portions 685U comprising a solder material. The lower portions 685L and the upper portions 685U may be also referred as conductive pillars 685L and solder caps 685U, respectively.

Connectors 685 can be coupled to conductive features of the processed wafer 511 in the logic area 550, memory area 560, and/or thermal dissipation area 570. Such conductive features can include for example an interconnect 530 (see FIG. 28), vias, such as via 546, 525, or 535 (see FIG. 30), or other metal traces or lines.

Figure 42:
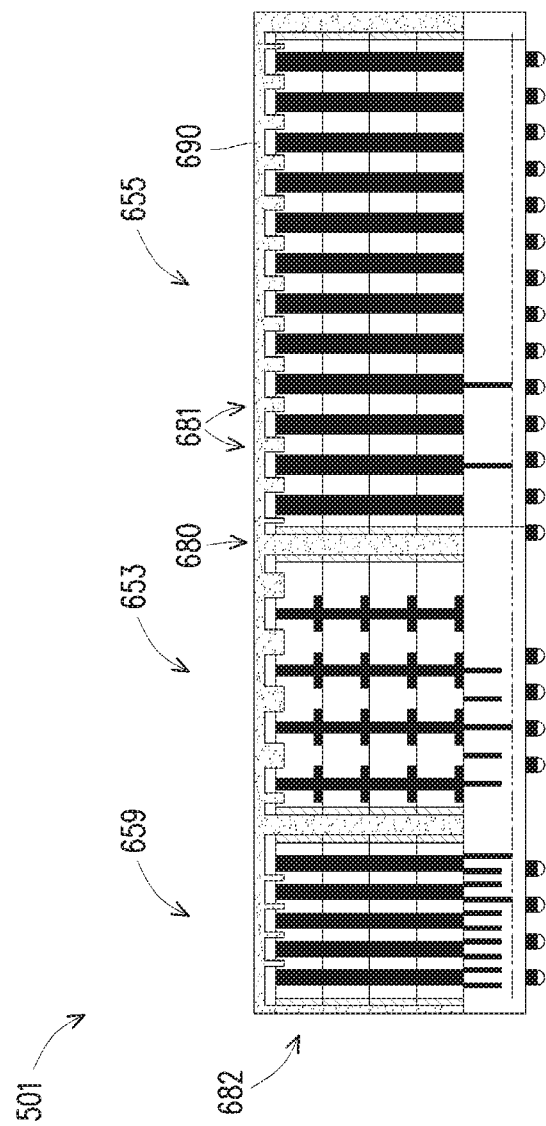

Referring to FIG. 42, a thermal interface material (TIM) 690 is formed over the application package 501. In some embodiments, the TIM 690 is dispensed over the die stacks 653/655/659 and on their sides, including sidewalls 682 of the die stacks, between the die stacks, in openings 680, and in trenches 681. In some embodiments, the TIM 690 is dispensed over the die stacks 653/655/659, including enough material to be squeezed into openings 680 and trenches 681. The TIM 690 is a material having a good thermal conductivity, which may be greater than about 5 W/m*K, and may be equal to, or higher than, about 50 W/m*K or 100 W/m*K.

Figure 43:
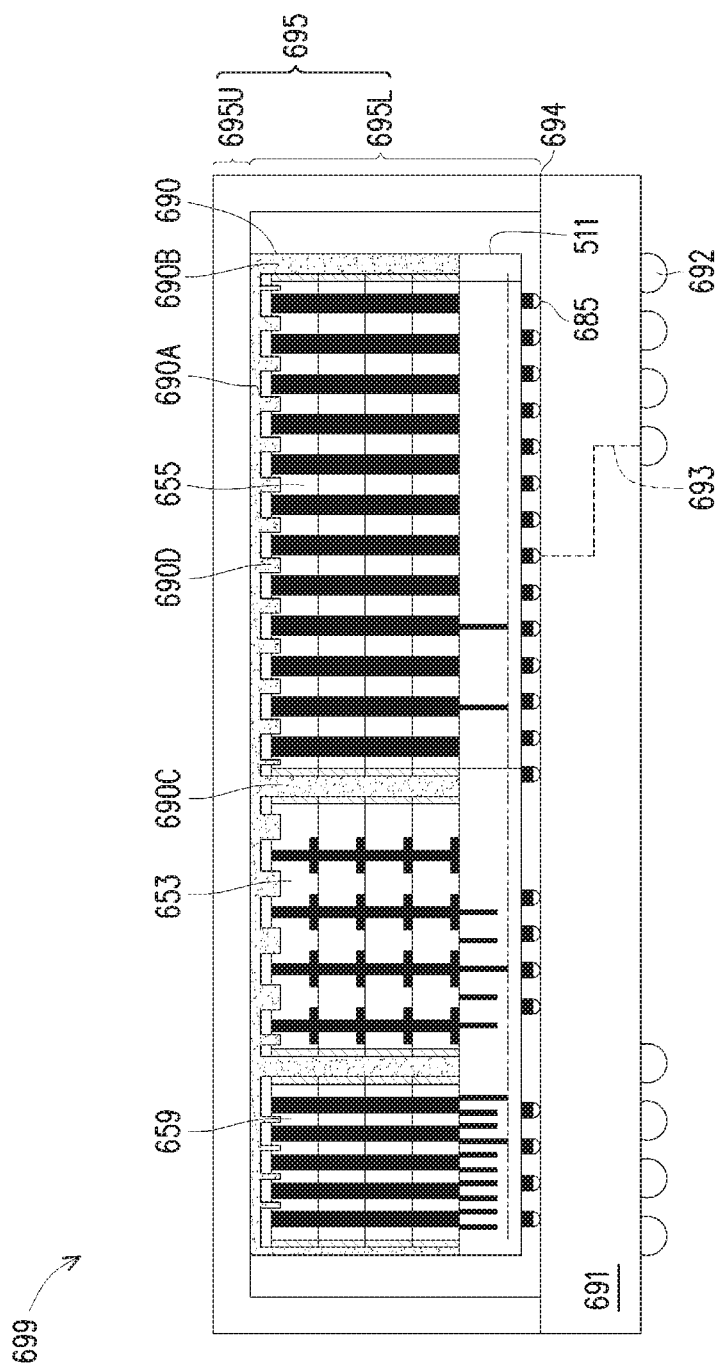

Referring to FIG. 43, the package 501 can be coupled to a package component 691, which may be a package substrate, an interposer, a Printed Circuit Board (PCB), or the like. In some embodiments, package component 691 includes metal traces and/or vias 693 (illustrated using dashed lines) that interconnect the electrical connectors (such as metal pads (not shown) and/or solder balls 692) on the opposite sides of package component 691. Discrete passive devices (not shown) such as resistors, capacitors, transformers, and the like, may also be bonded to package component 691. Solder balls 692 are attached to package component 691, wherein application package 501 and connectors 685 are on the opposite sides of package component 691. The application package 501 and package component 691 (and other attached devices) are in combination referred to as package 699.

Still referring to FIG. 43, a heat spreader 695 is mounted. Heat spreader 695 comprises an upper portion 695U and lower portion 695L, which may be one total piece or two or more separate pieces. The upper portion 695U covers over the whole package 699 and contacts the lower portion on opposite sides of the package 699. In some embodiments, the lower portion 695L is only on two opposite sides of the package 699 at the periphery. In some embodiments, the lower portion 695L can completely surround the periphery of the package 699. In some embodiments, the lower portion 695L can partially surround the periphery of the package 699 in multiple segments on two or more sides, with at least two of the sides being opposite to each other. In some embodiments, only the upper portion 695U is present. In some embodiments, the lower portion 695L may extend from the bottom of the upper portion 695U, but not all the way to the package component 691. In some embodiments, the lower portion 695L can be attached by an adhesive 694 to the package component 691.

An adhesive 694 may have a thermal conductivity lower than the thermal conductivity of TIM 690. Adhesive 694 may have a better adhering ability than TIM 690.

In the mounting of the heat spreader 695, the heat spreader 695 is pushed down. As a result, TIM 690 may be squeezed and pushed into the openings 680, and trenches 681, and along the sidewalls 682 (see FIG. 42) of the stacked dies. The resulting TIM 690 includes a top portion 690A, sidewall portions 690B, gap-fill portions 690C, and trench-fill portions 690D. TIM sidewall portions 690B may, or may not, form a ring encircling the application package 501. In some embodiments, TIM sidewall portions 690B may extend lower than the application die 501 and may contact the package component 691.

Heat spreader 695 has a high thermal conductivity and may be formed using a metal, a metal alloy, or the like. For example, heat spreader 695 may comprise a metal, such as Al, Cu, Ni, Co, and the like, or an alloy thereof. Heat spreader 695 may also be formed of a composite material selected from the group consisting of silicon carbide, aluminum nitride, graphite, and the like.

Figure 44:
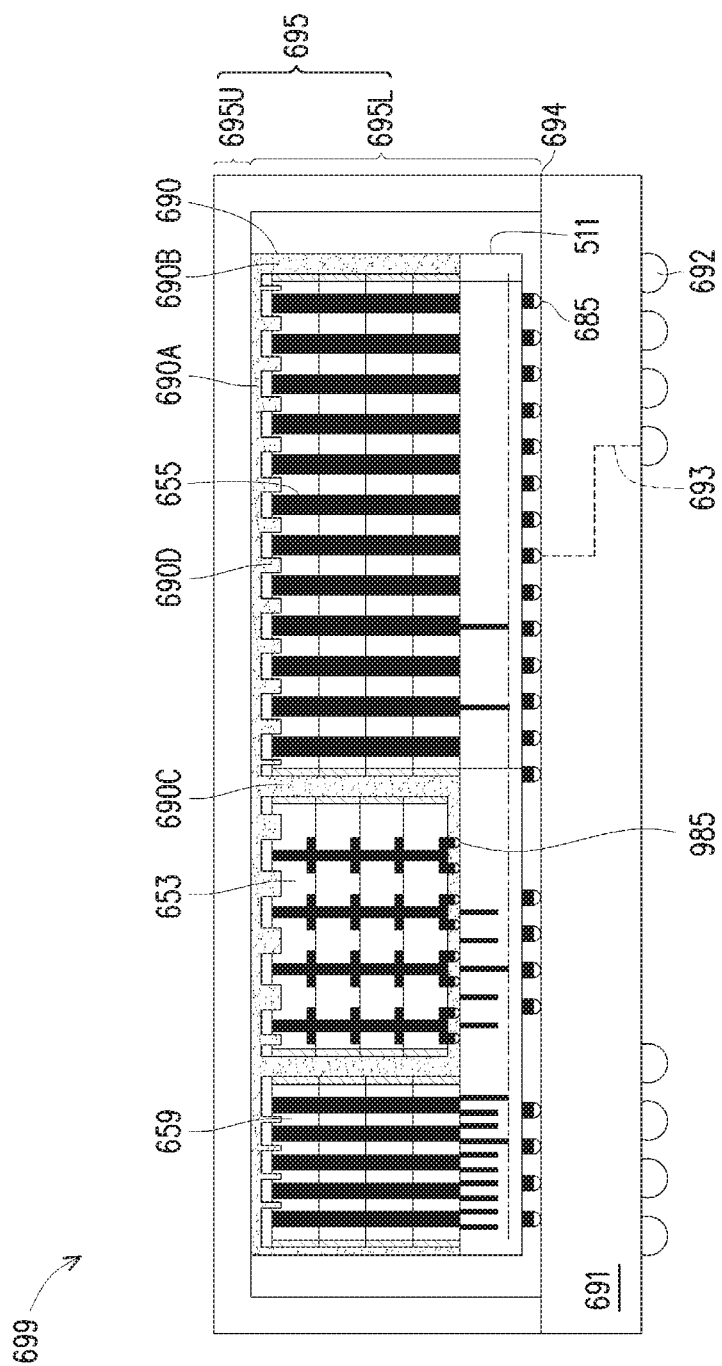

FIG. 44 illustrates a package device in accordance with some embodiments. In FIG. 44, the die stacks 653, 655, and 659 are formed separately, and then attached to the processed wafer 511. After the die stacks 653, 655, and 659 are attached to the processed wafer 511, the package device can be formed using processes and materials such as those discussed above with respect to FIGS. 36 through 43. In particular, after the die stacks 653, 655, and 659 are attached to the processed wafer 511, a gap fill material may be applied over and in between the attached dies, such as discussed above with respect to the gap fill material 616 of FIG. 32, for example. The process may then proceed in a manner such as discussed above with respect to FIGS. 37 through 43.

In the illustrated embodiment of FIG. 44, die stack 653 is a die stack similar to die stack 102a as discussed above with respect to FIG. 24 or 27. In some embodiments, the backside carrier 206a may be removed, while in other embodiments the backside carrier 206a may be left intact or thinned. Die stack 653 is attached to processed wafer 511 using connectors 985. Die stacks 655 and 659 are attached to the processed wafer 511 by hybrid bonding, such as discussed above.

FIGS. 45 through 58 illustrate various intermediate steps in creating an application package, in accordance with some embodiments.

Figure 45:
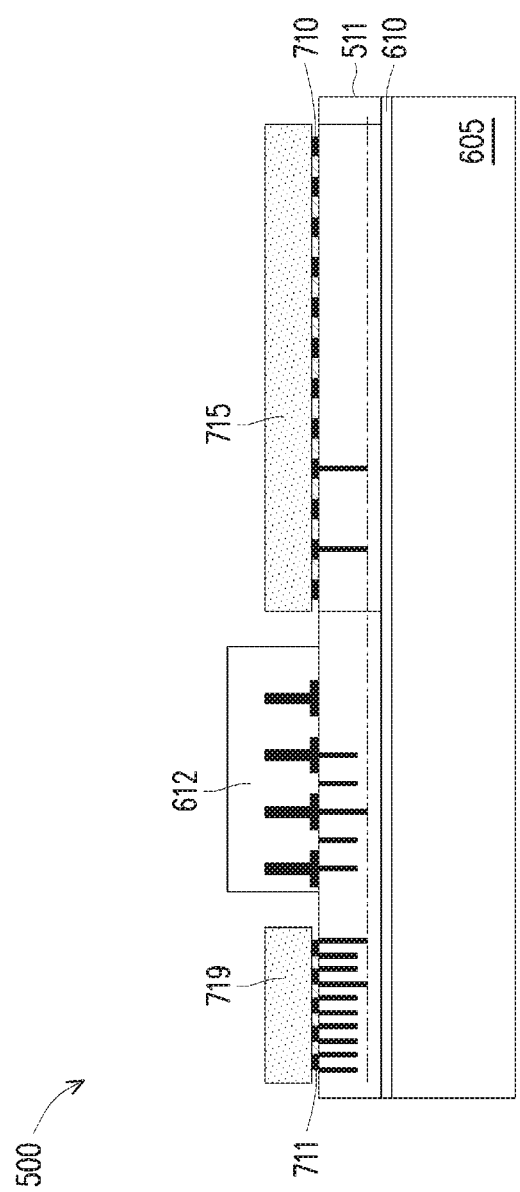
FIGS. 45 through 58 illustrate intermediate steps in a process of forming a packaged device, in accordance with some embodiments.

Referring to FIG. 45, application package 500 comprises a thinned processed wafer 511 which can include the features of and be formed using the processes and materials of processed wafer 510 of FIG. 28, which is described above and not repeated. Processed wafer 510 can likewise be bonded to a carrier 605 (FIG. 29) and thinned (FIG. 30) using processes and materials as described above.

Die 612 and thermal metal pieces 715 and 719 are bonded to processed wafer 511. In some embodiments, die 612 and thermal metal pieces 715 and 719 are attached to the processed wafer 511 using, for example, a pick and place apparatus. In other embodiments, die 612 and thermal metal pieces 715 and 719 may be attached to the processed wafer 511 manually, or using any other suitable method. Thermal metal pieces 715/719 can be referred to as heat dissipating structures.

Die 612 can be a die consistent with die 612, as described above with respect to FIG. 31.

Thermal metal pieces 715 and 719 can be thermal metal bulk material that has prepared dimensions suitable for the respective footprint of the mounting area over the logic area 550 and footprint of the mounting area over the thermal dissipation area 570 of processed wafer 511. In some embodiments, the thickness of the thermal metal pieces 715 and 719 can be selected to be a desired thickness of the layer (see 721 of FIG. 48). For example, the thickness can be selected to be about 20 μm. In some embodiments, the thickness of the thermal metal pieces 715 and 719 can be selected to be a thickness greater than the desired thickness of the layer (721 of FIG. 48). The material of thermal metal pieces may comprise a metal, such as Al, Cu, Ni, Co, and the like, or an alloy thereof.

Still referring to FIG. 45, die 612 can be bonded to processed wafer 511 using the processes and materials as described above with respect to FIG. 31.

Thermal metal pieces 715 and 719 can be bonded to the logic area 550 and thermal dissipation area 570 of the processed wafer 511. In some embodiments, metal pads 710 may be formed over the logic area 550 of the processed wafer. Metal pads 710 may or may not protrude from a top surface of the processed wafer 511. Metal pads 710 can correspond to the contacts or contact pads 545 such described above with respect to FIG. 30 and may couple to one or more vias 546 in the logic area 550 of the processed wafer 511. In some embodiments, metal pads 711 can be formed over the thermal dissipation area 570 of the processed wafer 511 and coupled to the vias 535. In some embodiments, metal pads 711 may protrude from a top surface of the processed wafer 511. Metal pads 711 can be formed, for example, using processes and materials such as described above with respect to FIG. 1 and FIG. 18, for forming contacts and is not repeated.

In some embodiments, thermal metal pieces 715 and 719 can be hybrid bonded to processed wafer 511 by aligning and directly bonding the metal surfaces of the thermal metal pieces 715 and 719 to the processed wafer 511. It should be understood that the bonding of the vias and contacts illustrated in FIG. 45 are merely an example, and other configurations of hybrid bonded elements are contemplated. Hybrid bonding can be carried out using processes and materials as described above with respect to FIG. 17, which are not repeated, including any combination of hybrid bonding of vias and contacts. For example, the bonding surface of the thermal metal pieces 715 and 719 can be considered as a large contact for the purposes of hybrid bonding which can be bonded to other contacts, such as metal pads 710 or 711 or bonded to vias, such as vias 535 or 546 (see FIG. 30). As with the die 612, no underfill is needed between the metal pieces 715/719 and the processed wafer 511.

In some embodiments, metal piece 715 is bonded to vias 546 or metal pads 710 and metal piece 719 is bonded to vias 535 or metal pads 711 by forming a eutectic-type connector or conductive pillar at the bond points between the metal pieces 715/719 and the processed wafer 511, bringing the metal pieces 715/719 together with the processed wafer 511 after aligning the corresponding contacts, and reflowing the eutectic materials to form a physical and electrical coupling. The eutectic-type connector or conductive pillar can be formed on either side or on both sides of the bond point, i.e. on the metal pieces 715/719 and/or on the processed wafer 511. In such embodiments, an underfill material can be used between the die 612 and processed wafer 511 and between the metal pieces 715/719 and the processed wafer 511, or alternatively a gap-fill material, such as described below, can provide underfill capabilities.

Figure 46:
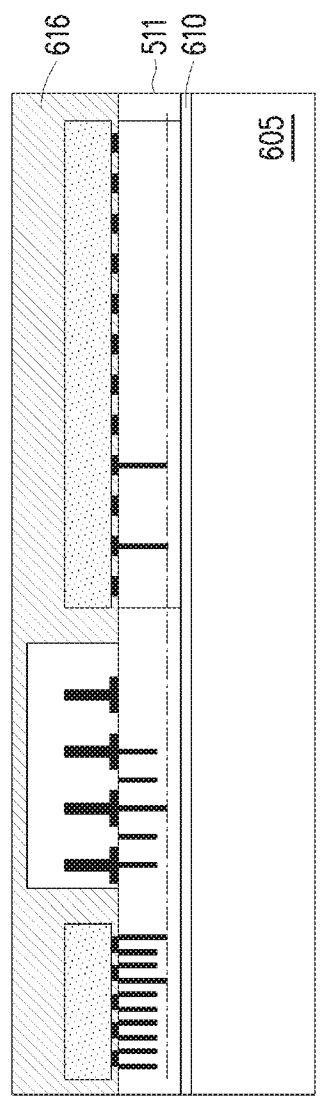

Referring to FIG. 46, a gap-fill material 616 is formed over the workpiece to substantially fill the spaces between the die 612 and thermal metal pieces 715 and 719. The processes and materials can be the same as described above with respect to the gap-fill material of FIG. 32 and are not repeated.

Figure 47:
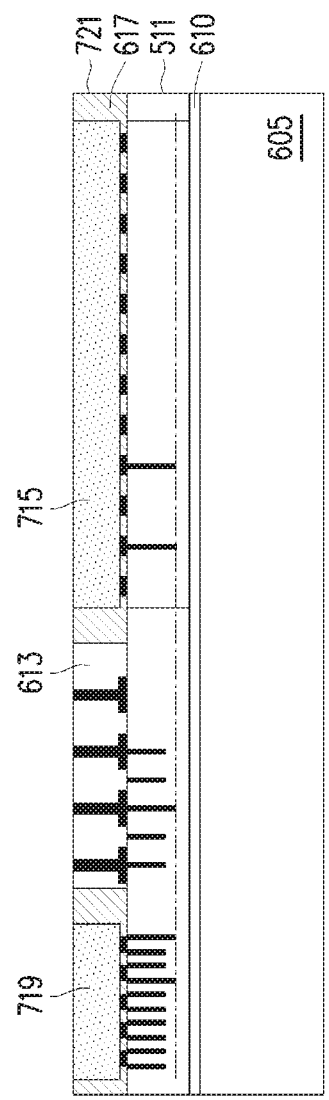

Referring to FIG. 47, the gap-fill material 616 and die 612 can be thinned to create gap-fill material 617 and thinned die 613. Thinning can be done by a CMP process, grinding, etching, or other suitable process. Thinning exposes vias 120 in die 613 and also reduces the thickness of die 613 to provide better heat dissipation and take less space. In some embodiments, where the thermal metal pieces 715/719 are thicker than the desired thickness, the thermal metal pieces 715/719 are also thinned. For example, the thermal metal pieces 715/719 may be thicker than a desired thickness, but thinner than die 612. After thinning, the layer 721 comprising thinned die 613, thermal metal pieces 715/719, and thinned gap-fill material 617 can be about 10 to 50 µm thick, for example, about 20 µm thick. In some embodiments, a top surface of the gap-fill material 617 and top surfaces of the die 613 and thermal metal pieces 715/719 are substantially co-planar within process variations.

Figure 48:
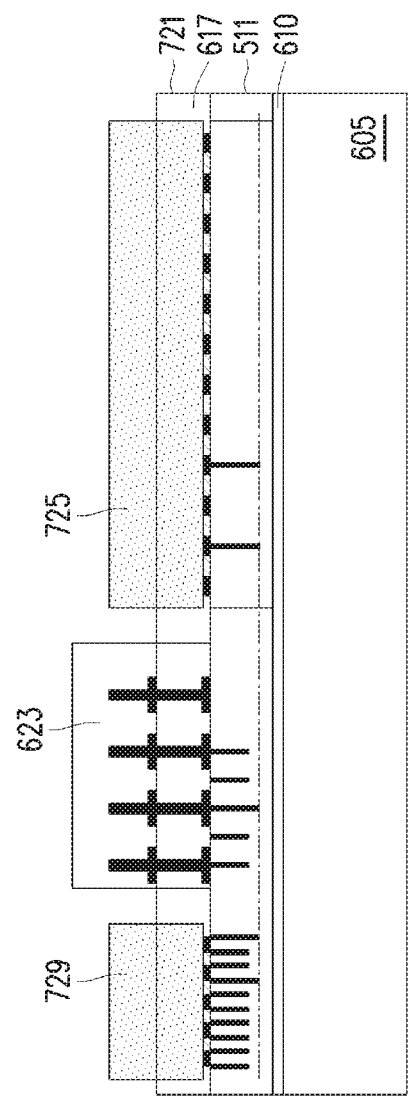

Referring to FIG. 48, in some embodiments, die 622 and thermal metal pieces 725 and 729 are bonded to die 613 and thermal metal pieces 715 and 719, respectively, to form a die stack and thermal metal bulk. In some embodiments, die 622 can be the same type of device, chip, or die as 613. In some embodiments, die 622 can be a different type of device, chip, or die than die 613. Die 622 can be bonded to die 613 and metal pieces 625/629 can be respectively bonded to metal pieces 615/619, in like manner as dies 612, 614, and 618 are bonded to processed wafer 511, as described above with respect to FIG. 45, and is not repeated here. In particular, die 622 can be hybrid bonded to die 613 by a direct bonding of contact pads 125 of die 622 and vias 120 or contact of dies 613. Similarly, thermal metal piece 725 can be bonded thermal metal piece 715 by a direct bonding of their respective surfaces. Likewise, thermal metal piece 729 can be bonded thermal metal piece 719 by a direct bonding of their respective surfaces. In some embodiments, a fusion boding of insulating materials of the dies 613 and 622 can also occur. The direct bonding of the metal pieces can result in a substantially bonded interface across the entire interface between the thermal metal pieces 715 and 725 and the thermal metal pieces 719 and 729.

Figure 49:
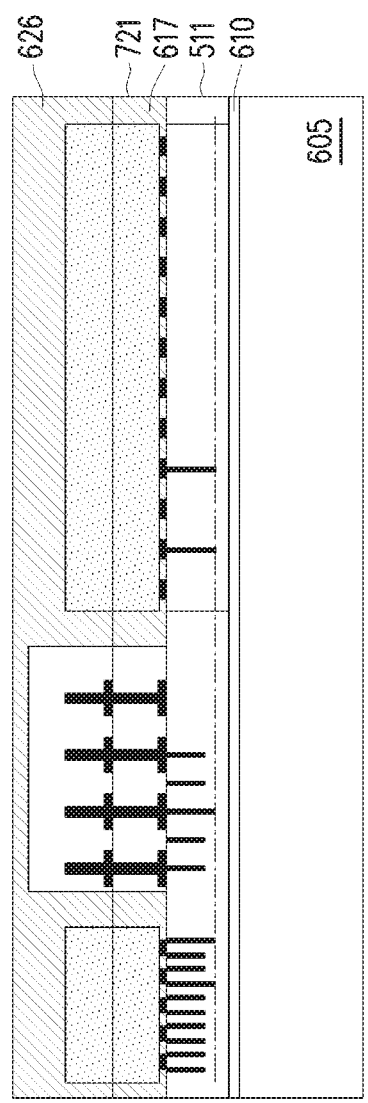

Referring to FIG. 49, a gap-fill material 626 is formed over the workpiece to substantially fill the spaces between dies 622 and thermal metal pieces 725 and 729. The process and materials is the same as those discussed above in relation to FIG. 46 for the formation of gap-fill material 616, and is not repeated.

Figure 50:
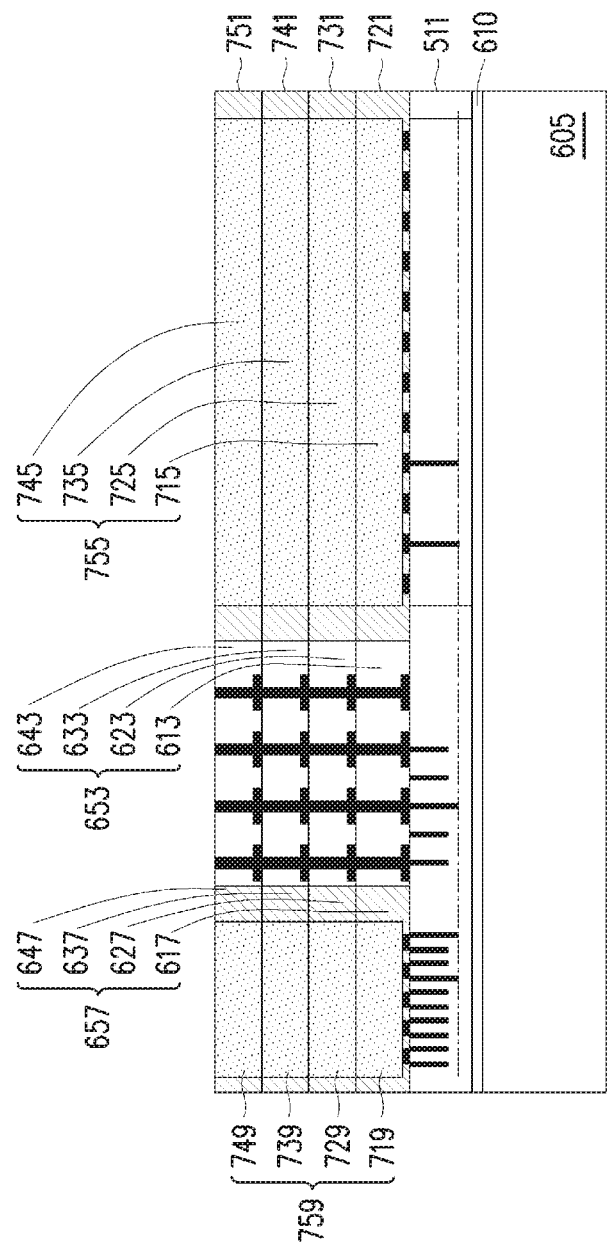

Referring to FIG. 50, in some embodiments, the process of thinning and attaching additional dies and thermal metal pieces of FIGS. 47-49 are repeated until a desired die stack configuration and thermal metal configuration is achieved. In some embodiments, a memory cube 653 can be formed by a four layer die stack of memory dies comprising memory dies 613, 623, 633, and 643. In some embodiments, a corresponding thermal metal bulk 755 can be formed by a four layer stack of thermal metal pieces comprising metal pieces 715, 725, 735, and 745. In some embodiments, a corresponding thermal metal bulk 759 can be formed by a four layer die stack of thermal metal pieces comprising thermal metal pieces 719, 729, 739, and 749. In some embodiments, the processed gap-fill material 657 can include distinguishable layers 617, 627, 637, and 647. In some embodiments, the processed gap-fill material 657 will be continuous throughout the die layers and indistinguishable in a cross-section view. Thermal metal bulk 755/759 can be referred to as heat dissipating structures.

In some embodiments, each of the stacks, i.e., memory cube 653, thermal metal bulk 755, and thermal metal bulk 759, may be formed by separate processes and attached to processed wafer 511. For example, memory cube 653 can be built using the processes described above with respect to FIG. 1-11 or 12-16. Similar processes can also be used to form thermal metal bulk 755 or 759 by substituting the layer-by-layer processes and materials for forming the thermal metal bulk described above into the processes illustrated in FIG. 1-11 or 12-16. Alternatively, a single layer thermal metal bulk can be used.

Figure 63A:
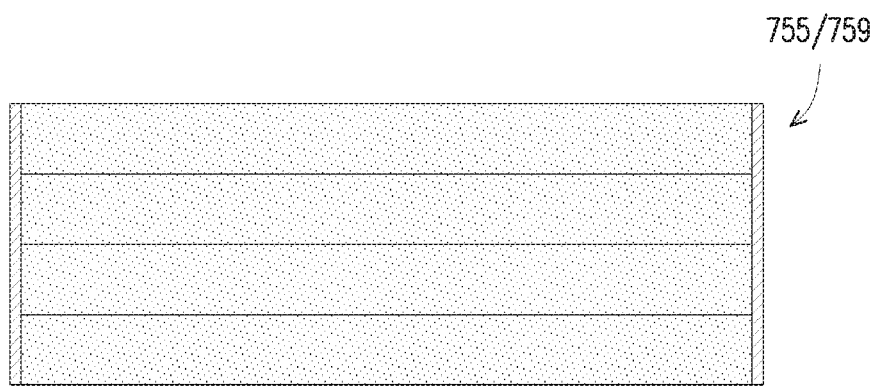
Figure 63B:
Figure 63C:
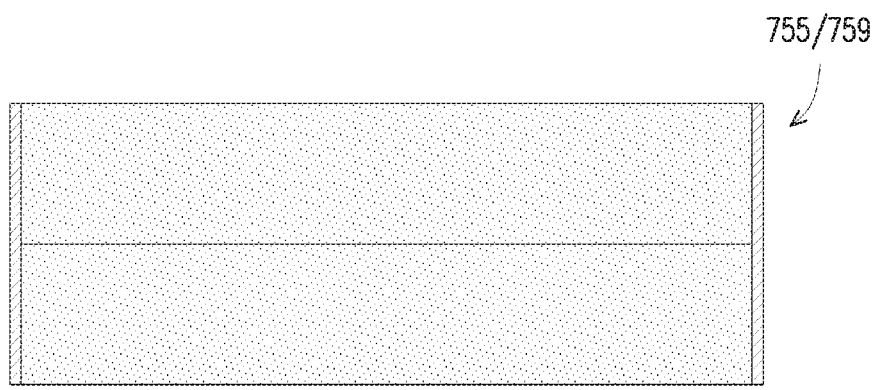
Figure 63D:
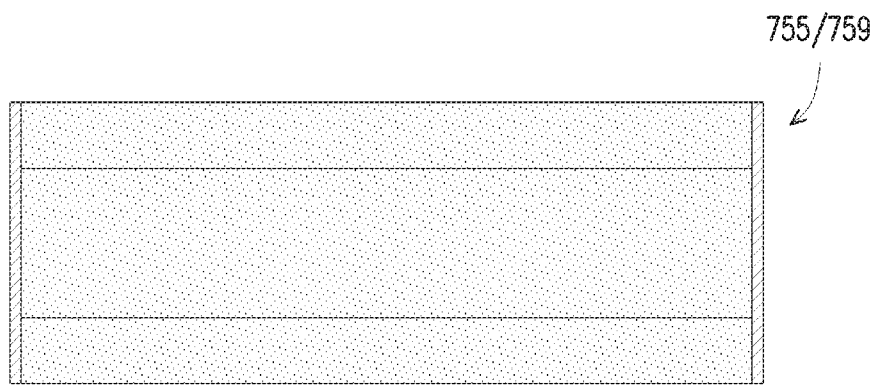

FIGS. 63A-63D illustrate various alternative embodiments for a separately formed thermal metal bulk 755 and 759, which is then attached to processed wafer 511. Because the thermal metal bulk 755 and 759 has no active or passive devices formed therein, the height of the individual layers is not critical. FIG. 63A illustrates a separately formed thermal metal bulk, in accordance with some embodiments, which is substantially similar to the thermal metal bulk 755 and 759 formed layer by layer, discussed above. FIG. 63B illustrates a separately formed thermal metal bulk which has an overall height greater than a desired height, which can be thinned after bonding. FIG. 63C illustrates a separately formed thermal metal bulk comprising two layers of approximately the same height. FIG. 63D illustrates a separately formed thermal metal bulk comprising three layers of varying heights. It should be understood that any number of layers can be used and that these embodiments can be combined in any combination.

Figure 51:
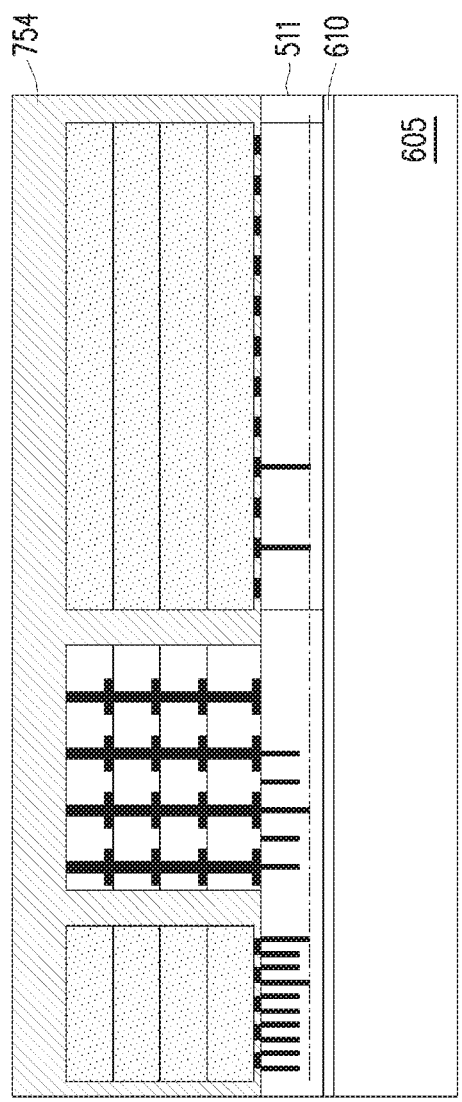

Referring to FIG. 51, in some embodiments, rather than apply the gap-fill material layer-by-layer, the gap-fill material 754 can be formed over the workpiece after all the dies 613, 623, 633, 643 have been processed (attached and thinned) and after both the thermal metal bulk 755 and 759 have been formed. The gap-fill material 754 can be formed over the entire workpiece and thinned such that a top surface of the gap-fill material is substantially co-planar with a top surface of the die stack 653 and top surfaces of the thermal metal bulk 755 and 759, within process variations. In such embodiments, the gap-fill material 754 will not have distinguishable layers, but will be continuous.

Figure 52:
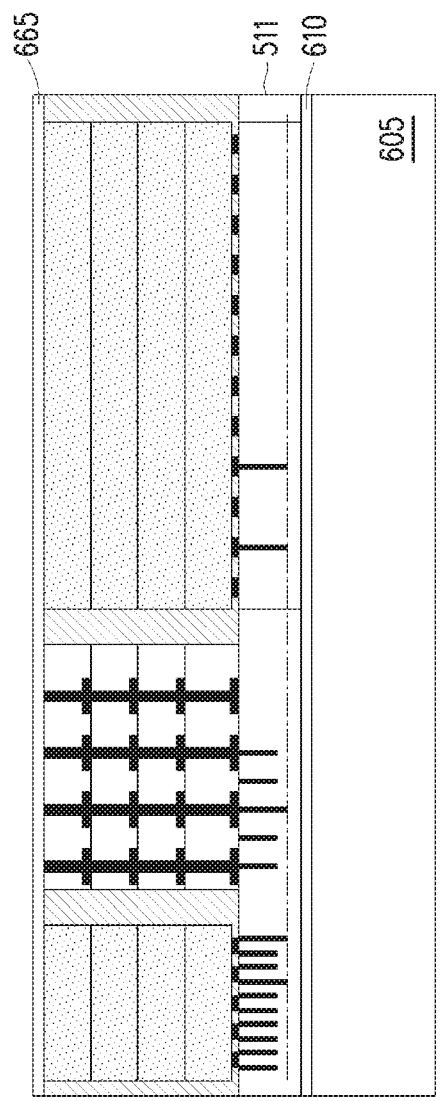

Referring to FIG. 52, a metal mask 665 is formed over the workpiece, in accordance with some embodiments. The metal mask 665 may be formed using processes and materials such as those described above with respect to FIG. 37, which are not repeated.

Figure 53:
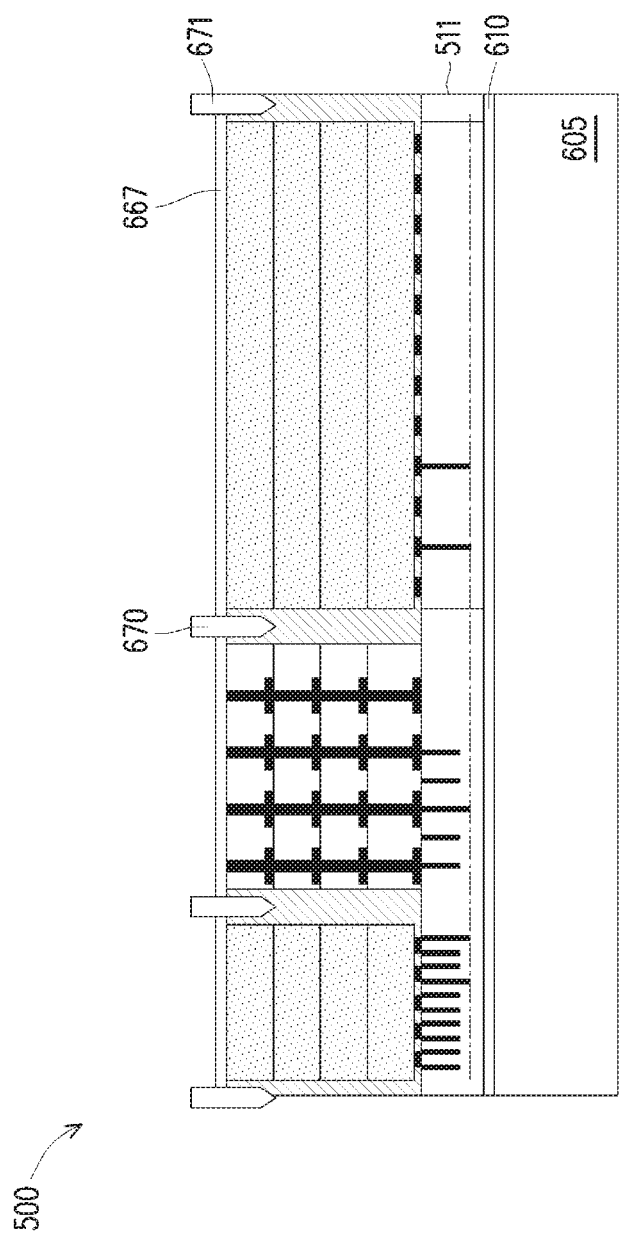

Referring to FIG. 53, the metal mask 665 can be patterned using processes and materials such as those described above with respect to FIG. 38, which are not repeated.

Figure 54:
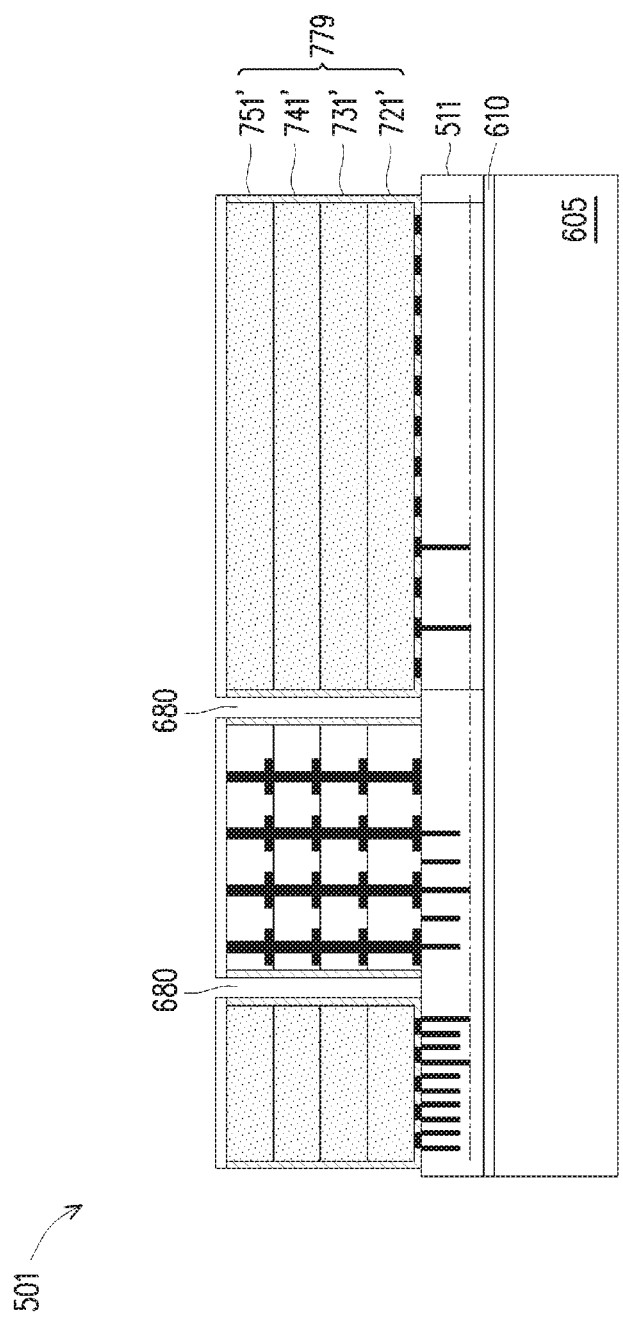

Still referring to FIG. 53, the gap-fill material 657/754 between the die stacks 653 and thermal metal bulk 755 and 759 are cut down to the surface of the processed wafer 511, using a cutting technique 670 to form openings 680 (see FIG. 54). Cutting technique 670 can be the same as the cutting technique 670 as described above with respect to FIG. 38 and is not repeated.

Still referring to FIG. 53, the multiple die packages formed from the processed wafer 511, such as application package 500, are singulated from the workpiece, resulting in a singulated application package 501 (see FIG. 54). Singulation 671 can be the same as the singulation technique 671 as described above with respect to FIG. 38 and is not repeated.

Referring to FIG. 54, the singulation 671 and gap-fill cutting 670 discussed above result in openings 680 between the die stack 653 and thermal metal bulk 655 and 659, and result in modified layers 721', 731', 741', and 751' of layer structure 779.

Figure 55:
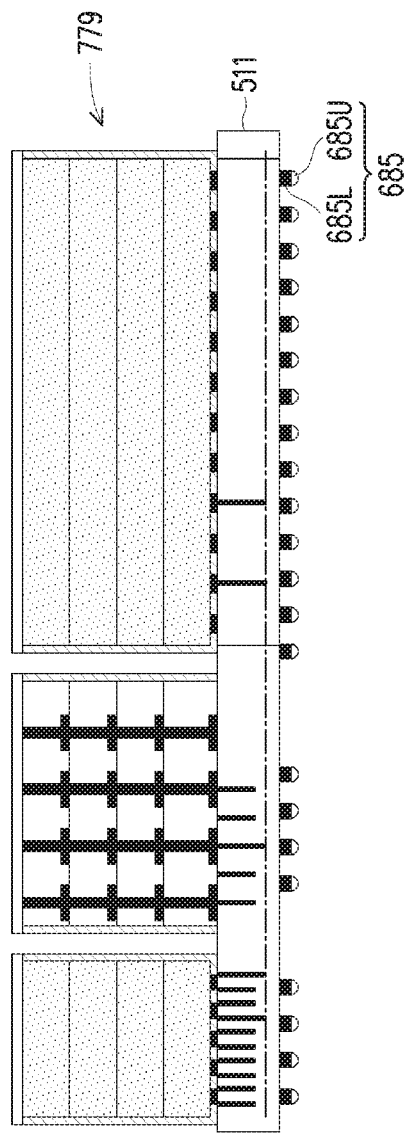

Referring to FIG. 55, following the singulation, the carrier 505 is removed from the application package 501. Removing the carrier 505 may include applying UV radiation to release layer 610, a mechanical grinding process, an etch back process, a heating process, combinations thereof, or the like.

Connectors 685 are formed on a front side of the processed wafer 511 of application package 501 using processes and materials such as those discussed above with respect to FIG. 41, which are not repeated.

Figure 56:
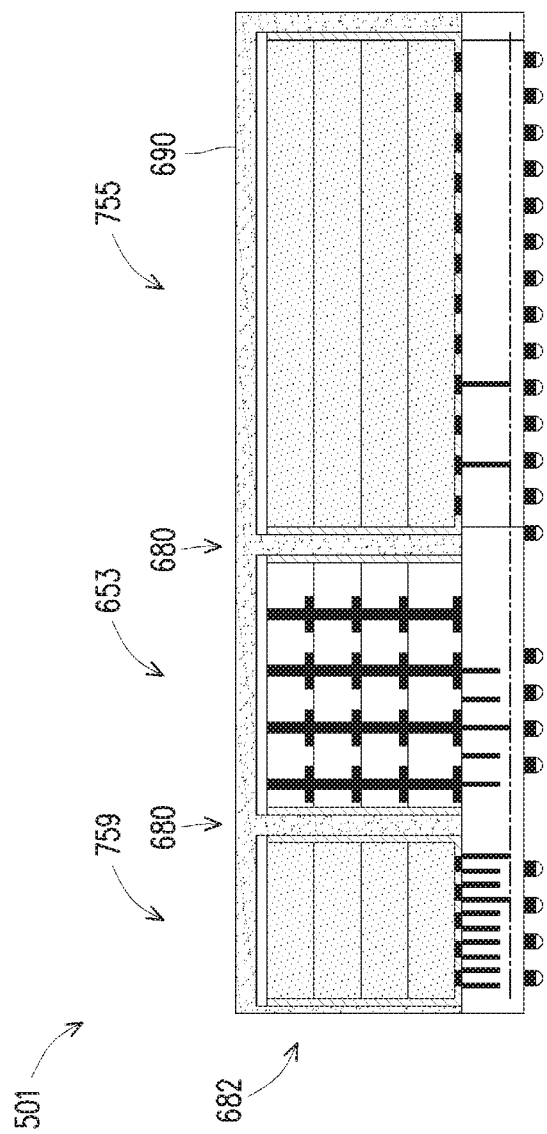

Referring to FIG. 56, a TIM 690 is formed over the application package 501, in like manner as discussed above with respect to FIG. 42, except instead of thermal chips 655 and 659, thermal metal bulk 755 and 759 are used.

Figure 57:
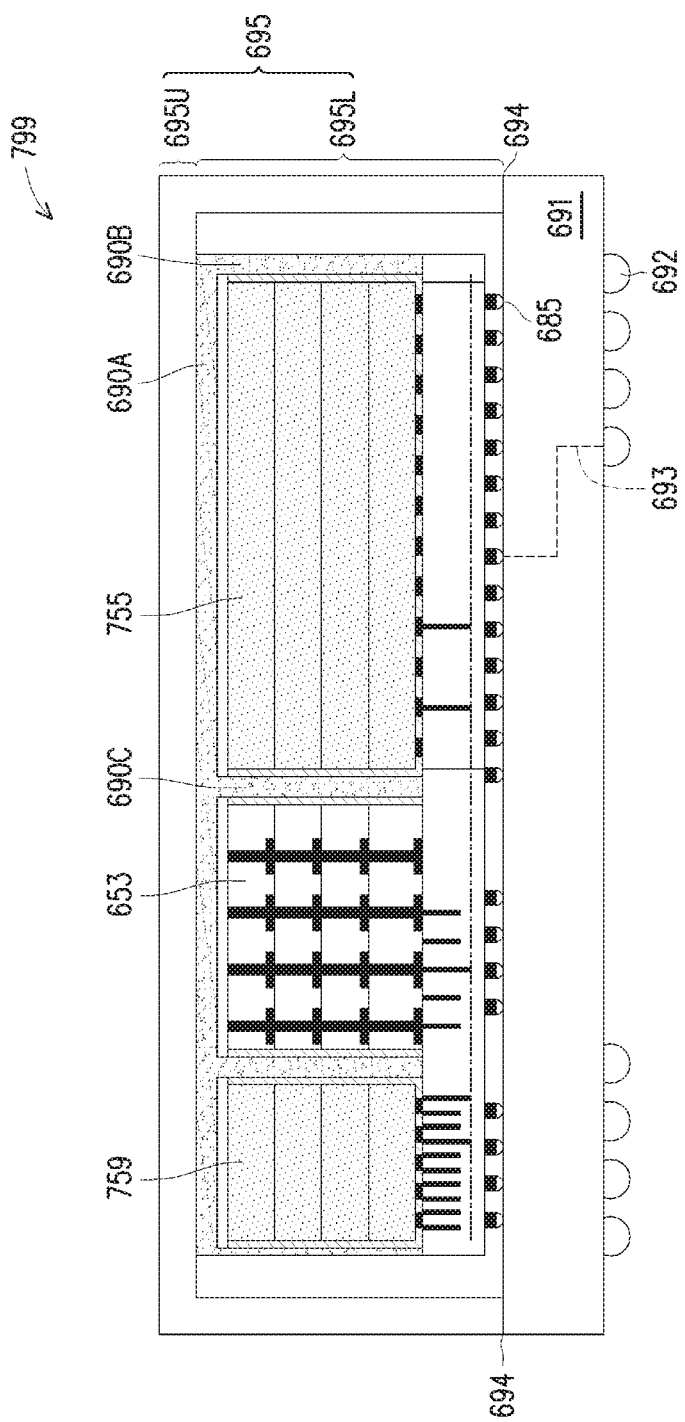

Referring to FIG. 57, the application package 501 can be coupled to a package component 691, using processes and materials such as those discussed above with respect to FIG. 43, which are not repeated.

Still referring to FIG. 57, a heat spreader 695 can be mounted using processes and materials such as those discussed above with respect to FIG. 43, which are not repeated.

Figure 58:
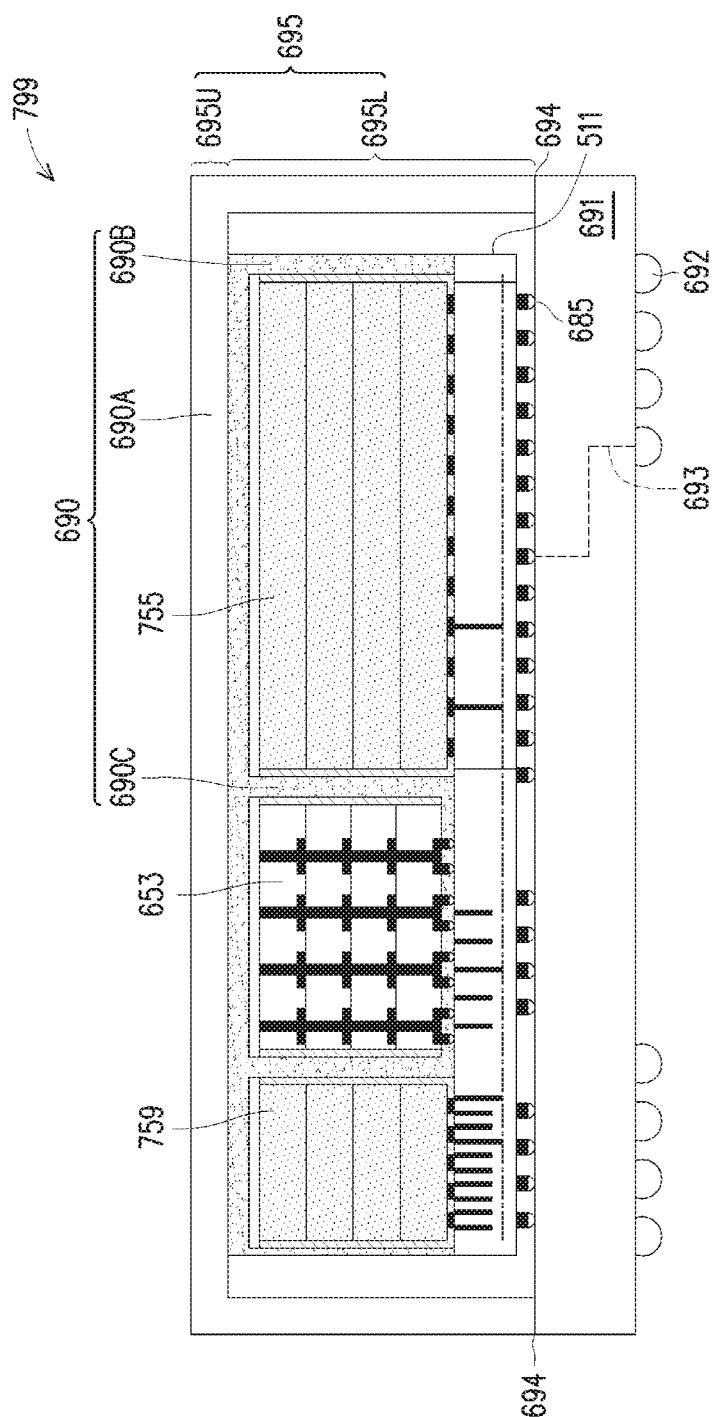

FIG. 58 illustrates a package device in accordance with some embodiments. In FIG. 58, the die stack 653 and thermal metal bulk 755 and 759 are formed separately, and then attached to the processed wafer 511. After the die stack 653 and thermal metal bulk 755 and 759 are attached to the processed wafer 511, the package device can be formed using processes and materials such as those discussed above with respect to FIGS. 50 through 57. In particular, after the die stacks 653, 755, and 759 are attached to the processed wafer 511, a gap fill material may be applied over and in between the attached dies, such as discussed above with respect to the gap fill material 754 of FIG. 51, for example. The process may then proceed in a manner such as discussed above with respect to FIGS. 51 through 57.

In the illustrated embodiment of FIG. 58, die stack 653 is a die stack similar to die stack 102a as discussed above with respect to FIG. 24 or 27. In some embodiments, the backside carrier 206a may be removed, while in other embodiments the backside carrier 206a may be left intact or thinned. Die stack 653 is attached to processed wafer 511 using connectors 985. Thermal metal bulk 755 and 759 are attached to the processed wafer 511 by hybrid bonding, such as discussed above.

Figure 59:
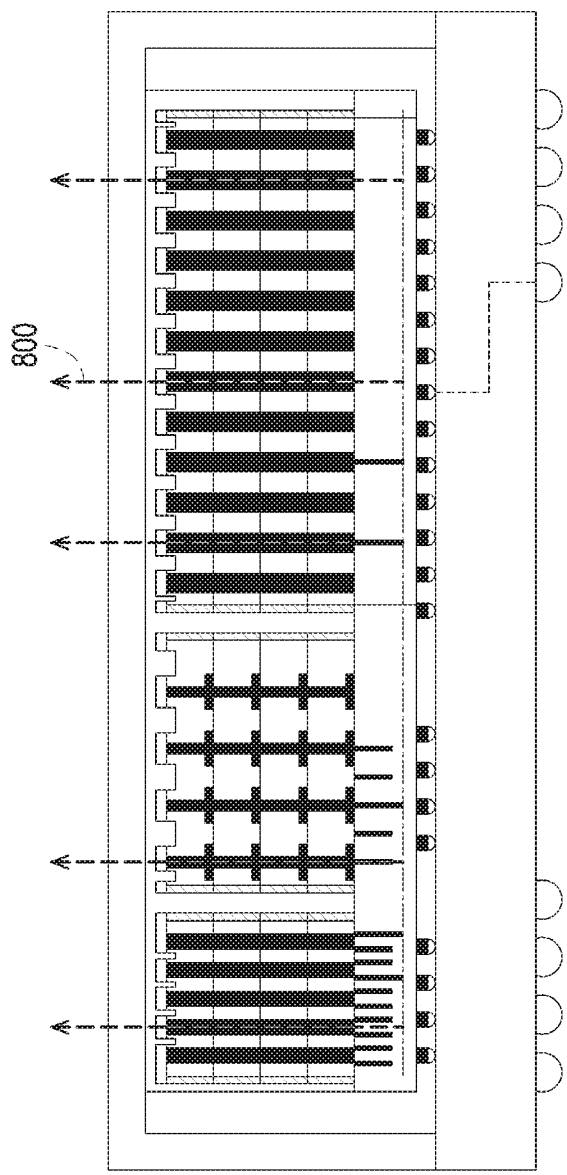
FIGS. 59 through 61 illustrate example heat dissipation paths, in accordance with various embodiments.
Figure 60:
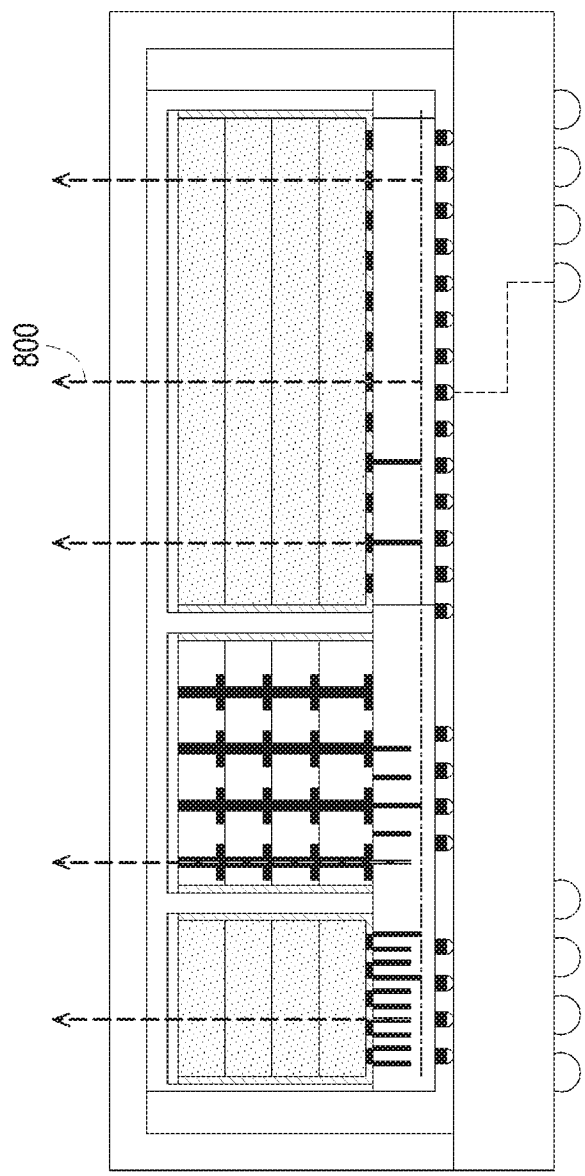
Figure 61:
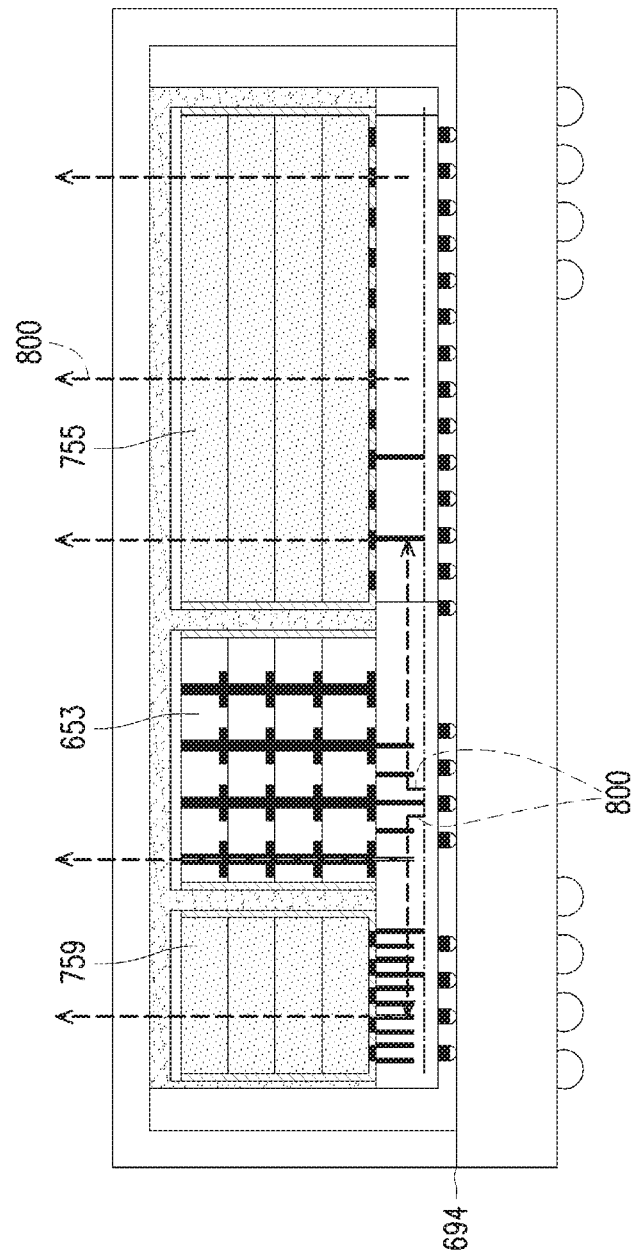

FIGS. 59-61 illustrate heat paths for dissipating heat generated in the processed wafer 511 and die stack 653. FIG. 59 corresponds to embodiments consistent with FIG. 43. Heat can be dissipated through the thermally conductive vias. FIG. 60 corresponds to embodiments consistent with FIG. 57. Heat can be dissipated through the thermally conductive vias and thermal metal bulk. FIG. 61 corresponds to an alternative embodiment similar to FIG. 57, except that thermally conductive vias are not provided in the die stack 653. As a result, thermal dissipation is performed through the adjacent thermal metal bulk 755/759.

Embodiments dissipate heat from a stacked die package. Embodiments include wafer on wafer, chip on wafer, and chip on chip hybrid bonding for high thermal conduction without an intermediate connection material. Embodiments include the ability to have different sizes or types of chips attached to each other through hybrid bonding. Embodiments include plasma dicing and plasma etching gap-fill material for smooth sidewalls between dies and between package components. In some embodiments, a memory cube is formed by multiple memory dies in a stacked configuration, in a chip on chip, chip on wafer, or wafer on wafer configuration. In some embodiments, a stacked package is formed on a wafer level device, such as an processing unit wafer used in a System-in-Package configuration. A memory cube can be deposited thereon, as a single package or layer by layer. Thermal chips or bulk thermal metal can be formed next two the memory cube for heat dissipation. A heat spreader can be attached to the device through a thermal interface material. Some embodiments use thermal vias that are directly bonded in a hybrid bonding technique. This technique provides bonding without the use of underfill or interlayer molding compounds, which can inhibit thermal dissipation. Some embodiments have a metal hard mask can be used to connect the thermal TSVs to a thermal interface material. Some embodiments have trenches in the heat dissipation features to increase the interface surface area contact.

One embodiment is a method that includes bonding a first surface of a plurality of first dies to a wafer, where each one of the plurality of first dies is in a respective package area of the wafer. A first gap-filling material is deposited over the plurality of first dies. The plurality of first dies and first gap-filling material are thinned, thereby exposing conductive through vias at a second surface of the plurality of first dies. A second die of a plurality of second dies is bonded to each one of the plurality of first dies and a second gap-filling material is deposited over the plurality of second dies. The plurality of second dies and second gap-filling material are thinned, thereby exposing conductive through vias at a second surface of the plurality of second dies. The method includes singulating the first and second gap-filling material, the singulating producing a die stack that includes a first die of the plurality of first dies and a second die of the plurality of second dies.

Another embodiment is a die stack structure that includes a first device, a second device, and a third device. The first device includes a semiconductor substrate, where the semiconductor substrate has a metal feature disposed at a surface thereof and includes active elements. The second device includes a substrate and plurality of conductive vias traversing through an entire thickness of the substrate. The plurality of conductive vias are disposed in the substrate aligned to an adjacent plurality of conductive vias of the first device at a first surface of the second device. A first conductive via of the plurality of conductive vias is bonded to the metal feature of the first device. The third device includes a metal feature disposed at a surface of the third device, where the metal feature of the third device is bonded to the first conductive via. The dies stack structure also includes a gap-fill material disposed on sidewalls of the second device and the third device.

Another embodiment is a package structure that includes a substrate, where the substrate includes a logic area, a memory area, a first surface having connectors formed thereon, and a second surface opposite the first surface. The package structure includes a logic device formed in the substrate in the logic area and a memory die stack attached to the second surface of the substrate in the memory area. The package structure also includes a first heat dissipating structure attached to the second surface of the substrate in the logic area and a thermal interface material disposed over the memory die stack and first heat dissipating structure. A heat spreader is disposed over and in contact with the thermal interface material.

Another embodiment is a device including a first die, the first die including a first set of vias traversing completely through the first die, and a second die, the second die including a second set of vias traversing completely through the second die, the first set of vias being aligned with and bonded to the second set of vias. The device also includes a first gap-fill material disposed on sidewalls of the first die and a second gap-fill material disposed on sidewalls of the second die.

Another embodiment is a die stack structure including a first device which includes a semiconductor substrate, the semiconductor substrate having a metal feature disposed at a surface thereof, the semiconductor substrate including active elements. The die stack structure also includes a second device which includes a substrate and plurality of conductive vias traversing through an entire thickness of the substrate, where the plurality of conductive vias are disposed in the substrate aligned to an adjacent plurality of conductive vias of the first device at a first surface of the second device, where a first conductive via of the plurality of conductive vias is bonded to the metal feature of the first device. The die stack structure further includes a third device which includes a metal feature disposed at a surface of the third device, where the metal feature of the third device is bonded to the first conductive via. A first gap-fill material is disposed on sidewalls of the second device and a second gap-fill material is disposed on sidewalls of the third device.

Another embodiment is a package structure including a substrate which includes a logic area and a memory area, where a first surface of the substrate has connectors formed thereon, where a second surface of the substrate is opposite the first surface, and where the logic area includes a logic device formed in the substrate. The package structure also includes a memory die stack attached to the second surface of the substrate in the memory area and a first heat dissipating structure attached to the second surface of the substrate in the logic area. A thermal interface material is disposed over and laterally surrounds the memory die stack and first heat dissipating structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first die, the first die comprising a first set of vias traversing completely through the first die and a first dielectric material surrounding the first set of vias;
   a second die, the second die comprising a second set of vias traversing completely through the second die and a second dielectric material surrounding the second set of vias, the first set of vias being aligned with and bonded to the second set of vias, wherein the first dielectric material is bonded to the second dielectric material, and wherein the first set of vias are directly bonded to the second set of vias without solder;
   a first molding compound material disposed on sidewalls of the first die; and
   a second molding compound material disposed on sidewalls of the second die.

2. The device of claim 1, wherein the first die and second die form a first die stack, the device further comprising a first substrate, the first substrate comprising a third set of vias disposed therein, the third set of vias being aligned with and bonded to the first set of vias, wherein the first molding compound material is disposed on a top surface of the first substrate.

3. The device of claim 2, wherein sidewalls of the first die are aligned with sidewalls of the first substrate.

4. The device of claim 2, further comprising a first heat dissipation feature, the first heat dissipation feature bonded to a logic area of the first substrate, the first heat dissipation feature having a top surface which is aligned with a top surface of the first die stack.

5. The device of claim 4, wherein the first heat dissipation feature comprises a first number of layers, wherein the first number is the same as a number of dies in the first die stack, wherein each corresponding die in the first die stack and layer in the first heat dissipation feature has the same thickness.

6. The device of claim 4, wherein the top surface of the first heat dissipation feature and the top surface of the first die stack have grooves disposed therein.

7. The device of claim 6, further comprising a thermal interface material disposed between the first die stack and the first heat dissipation feature, the thermal interface material extending over the top surface of the first die stack and over the top surface of the first heat dissipation feature.

8. The device of claim 7, further comprising:
a second substrate, the first substrate attached to the second substrate by a first set of connectors; and
a heat spreader attached to the thermal interface material and to the second substrate.

9. The device of claim 4, further comprising a second heat dissipation feature, the second heat dissipation feature bonded to a heat dissipating area of the first substrate, the second heat dissipation feature configured the same as the first heat dissipation feature, the second heat dissipation feature having a top surface which is aligned with a top the top surface of the first die stack.

10. A die stack structure, comprising:
a first device, comprising a semiconductor substrate, the semiconductor substrate having a metal feature disposed at a surface thereof, the semiconductor substrate comprising active elements;
a second device comprising a substrate and a plurality of conductive vias traversing through an entire thickness of the substrate, wherein the plurality of conductive vias are disposed in the substrate aligned to an adjacent plurality of conductive vias of the first device at a first surface of the second device, wherein a first conductive via of the plurality of conductive vias is bonded to the metal feature of the first device;
a third device comprising a metal feature disposed at a surface of the third device, wherein the metal feature of the third device is bonded to the first conductive via;
a first molding compound material disposed on sidewalls of the second device; and
a second molding compound material disposed on sidewalls of the third device, an outer sidewall of the second molding compound material aligned to an outer sidewall of the semiconductor substrate of the first device.

11. The die stack structure of claim 10, wherein one or more of the plurality of conductive vias comprises a contact pad.

12. The die stack structure of claim 10, wherein a contact pad of the first device is bonded to a first conductive via of the second device without a eutectic material, and wherein a first conductive via of the first device is bonded to a second conductive via of the second device without a eutectic material.

13. The die stack structure of claim 10, wherein molding compound material is disposed on sidewalls of the first device.

14. The die stack structure of claim 10, wherein each of the first, second, and third devices further comprises:
an top insulating material at a respective top surface; and
a bottom insulating material at a respective bottom surface, wherein at an interface of the first and second devices, the top insulating material of the first device is bonded to the bottom insulating material of the second device.

15. A package structure, comprising:
a substrate comprising a logic area and a memory area, a first surface of the substrate having connectors formed thereon, and a second surface of the substrate being opposite the first surface, the logic area comprising a logic device formed in the substrate;
a memory die stack attached to the second surface of the substrate in the memory area;
a first heat dissipating structure attached to the second surface of the substrate in the logic area; and
a thermal interface material disposed over and laterally surrounding the memory die stack and first heat dissipating structure.

16. The package structure of claim 15, wherein the substrate further comprises a heat dissipating area, the package structure further comprising:
a second heat dissipating structure attached to the second surface of the substrate in the heat dissipating area.

17. The package structure of claim 15, wherein the first heat dissipating structure comprises a plurality of thermal chips, each of the thermal chips comprising:
a plurality of conductive vias formed in a surrounding material, wherein each of the plurality of conductive vias traverses an entire thickness of the surrounding material.

18. The package structure of claim 17, wherein a first one of the plurality of thermal chips comprises a plurality of strips of thermal interface material inset into a top surface of the surrounding material.

19. The package structure of claim 15, wherein the first heat dissipating structure comprises a thermal metal bulk.

20. The package structure of claim 15, wherein the memory die stack comprises grooves disposed in a top surface of the memory die stack, the thermal interface material filling the grooves.

* * * * *